United States Patent
Yamamoto et al.

(10) Patent No.: US 8,854,283 B2
(45) Date of Patent: Oct. 7, 2014

(54) DISPLAY APPARATUS, PIXEL LAYOUT METHOD FOR DISPLAY APPARATUS, AND ELECTRONIC DEVICE

(75) Inventors: Tetsuro Yamamoto, Kanagawa (JP); Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 1239 days.

(21) Appl. No.: 12/591,288

(22) Filed: Nov. 16, 2009

(65) Prior Publication Data
US 2010/0149143 A1 Jun. 17, 2010

(30) Foreign Application Priority Data
Dec. 16, 2008 (JP) ................................ 2008-319252

(51) Int. Cl.
| | | |
|---|---|---|
| G09G 3/30 | (2006.01) |
| G06F 3/038 | (2013.01) |
| G09G 5/00 | (2006.01) |
| G09G 5/10 | (2006.01) |
| G09G 3/32 | (2006.01) |
| H01L 27/32 | (2006.01) |

(52) U.S. Cl.
CPC .......... *G09G 3/3225* (2013.01); *H01L 27/3276* (2013.01); *G09G 2320/02* (2013.01); *G09G 2300/0426* (2013.01); *G09G 2300/0819* (2013.01); *H01L 27/3223* (2013.01); *G09G 2300/0852* (2013.01); *H01L 27/3265* (2013.01); *H01L 27/326* (2013.01)
USPC ................ 345/76; 345/77; 345/204; 345/690

(58) Field of Classification Search
CPC ..................... G09G 3/3225; G09G 2300/0876
USPC ....................................................... 345/76–83
See application file for complete search history.

(56) References Cited

U.S. PATENT DOCUMENTS

| | | | | |
|---|---|---|---|---|
| 6,522,079 | B1 * | 2/2003 | Yamada ...................... | 315/169.3 |
| 2005/0030264 | A1 * | 2/2005 | Tsuge et al. .................... | 345/76 |
| 2005/0269959 | A1 | 12/2005 | Uchino et al. | |
| 2007/0176859 | A1 * | 8/2007 | Cok et al. ........................ | 345/76 |
| 2008/0030437 | A1 * | 2/2008 | Iida et al. ........................ | 345/80 |

FOREIGN PATENT DOCUMENTS

| | | |
|---|---|---|
| JP | 2001-109405 A | 4/2001 |
| JP | 2002-076359 A | 3/2002 |

(Continued)

OTHER PUBLICATIONS

Japanese Office Action issued Nov. 30, 2010 for corresponding Japanese Application No. 2008-319252.

*Primary Examiner* — Sumati Lefkowitz
*Assistant Examiner* — David Tung
(74) *Attorney, Agent, or Firm* — Rader, Fishman & Grauer PLLC

(57) ABSTRACT

In a display apparatus, a plurality of pixels are disposed in an array. Each pixel includes: an electro-optical element; a write transistor that writes a picture signal; a drive transistor that drives the electro-optical element according to the picture signal written by the write transistor; a hold capacitor, connected between the gate and source electrodes of the drive transistor, that holds the picture signal written by the write transistor; and an auxiliary capacitor, connected between the anode of the electro-optical element and a fixed potential node. Each auxiliary capacitor is formed straddling the boundary between specific pixel pairs adjacent in the pixel layout direction on a pixel row. An island metal pattern is formed between pixel pairs other than the specific pixel pairs, at a site corresponding to that of the auxiliary capacitor.

17 Claims, 18 Drawing Sheets

(56) References Cited

FOREIGN PATENT DOCUMENTS

| JP | 2004-109812 A | 4/2004 |
| JP | 2008-345722 | 12/2005 |
| JP | 2008-051990 | 3/2008 |
| JP | 2008-233125 A | 10/2008 |

* cited by examiner

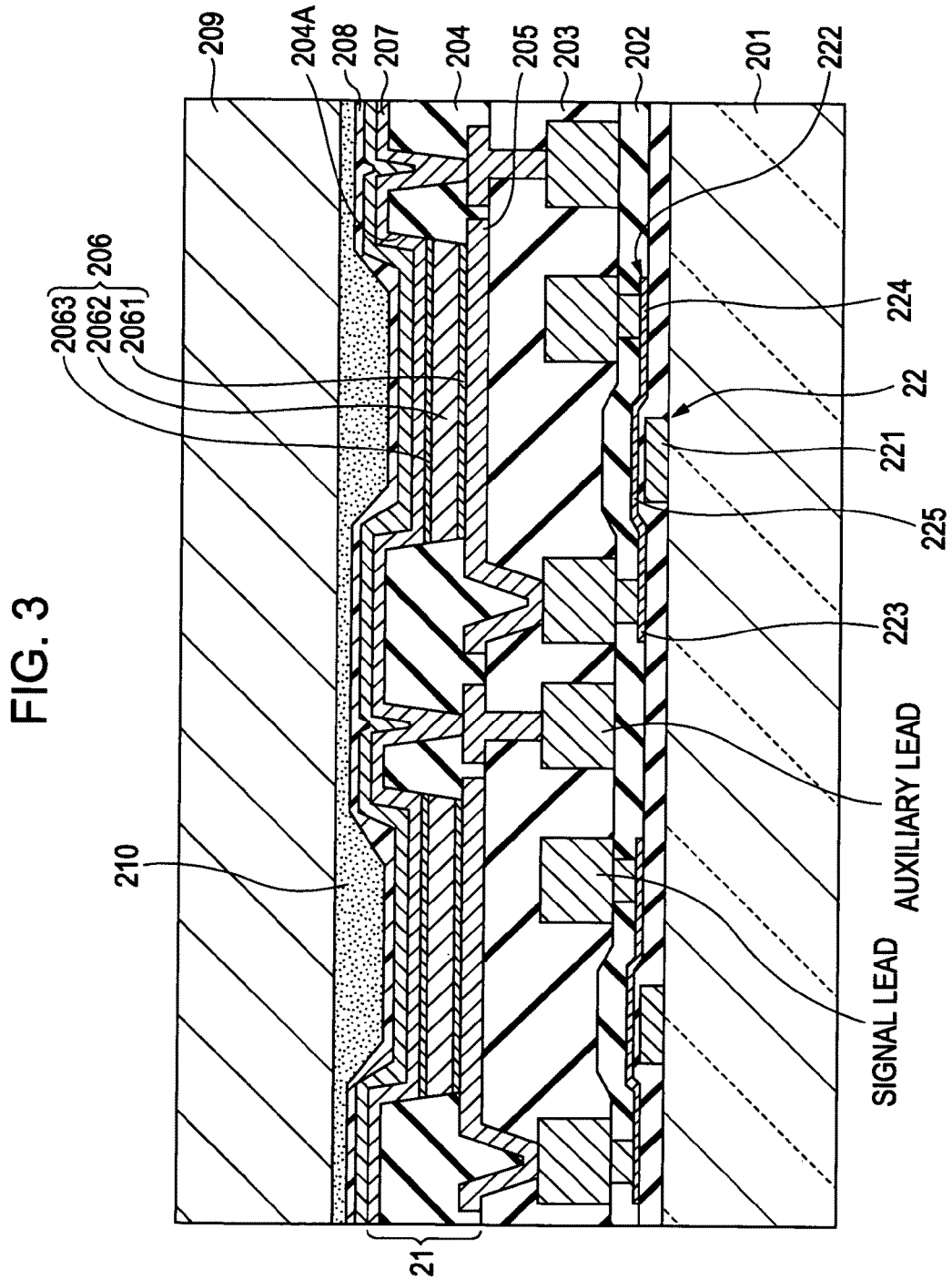

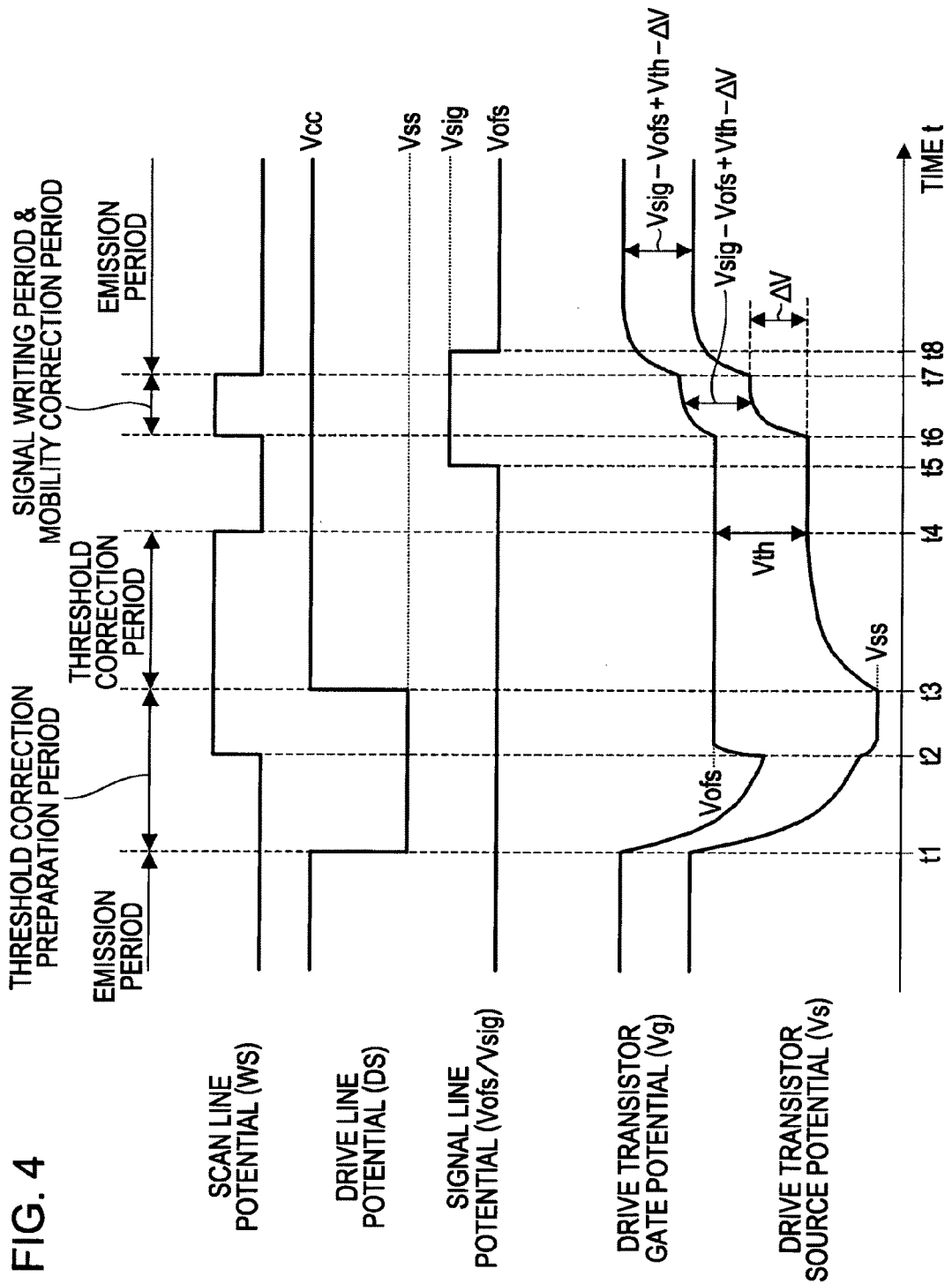

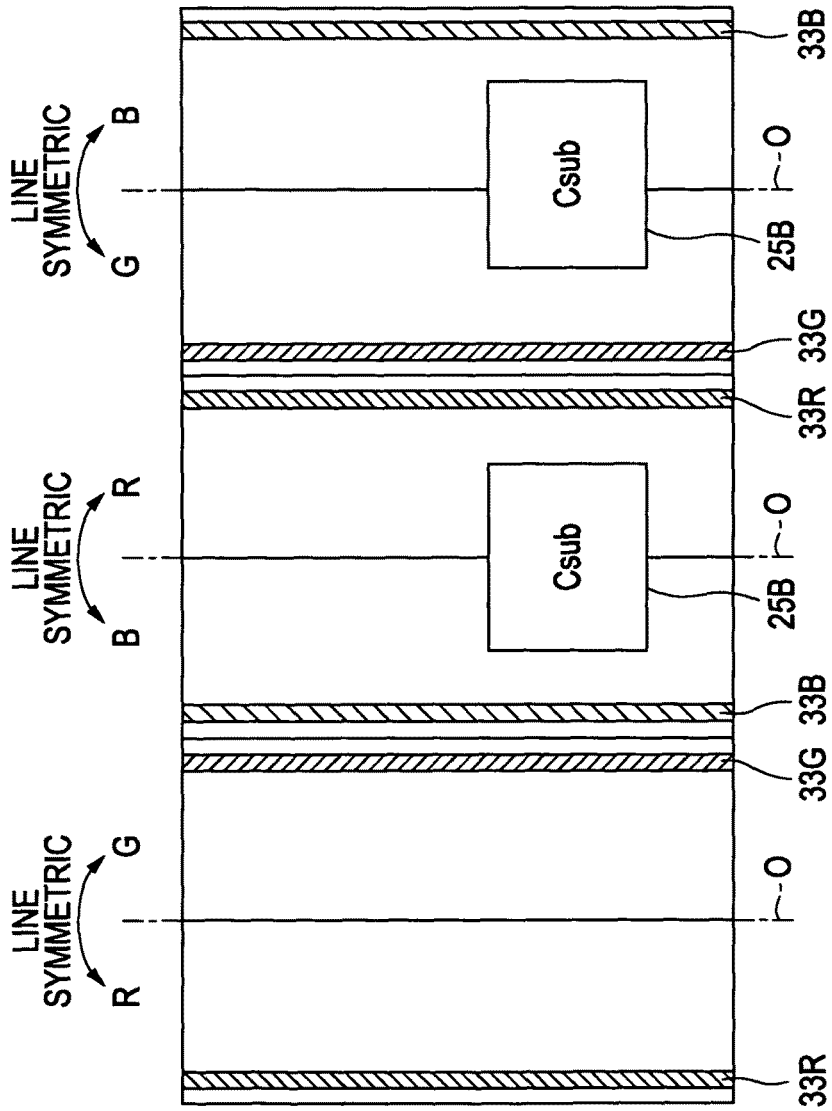

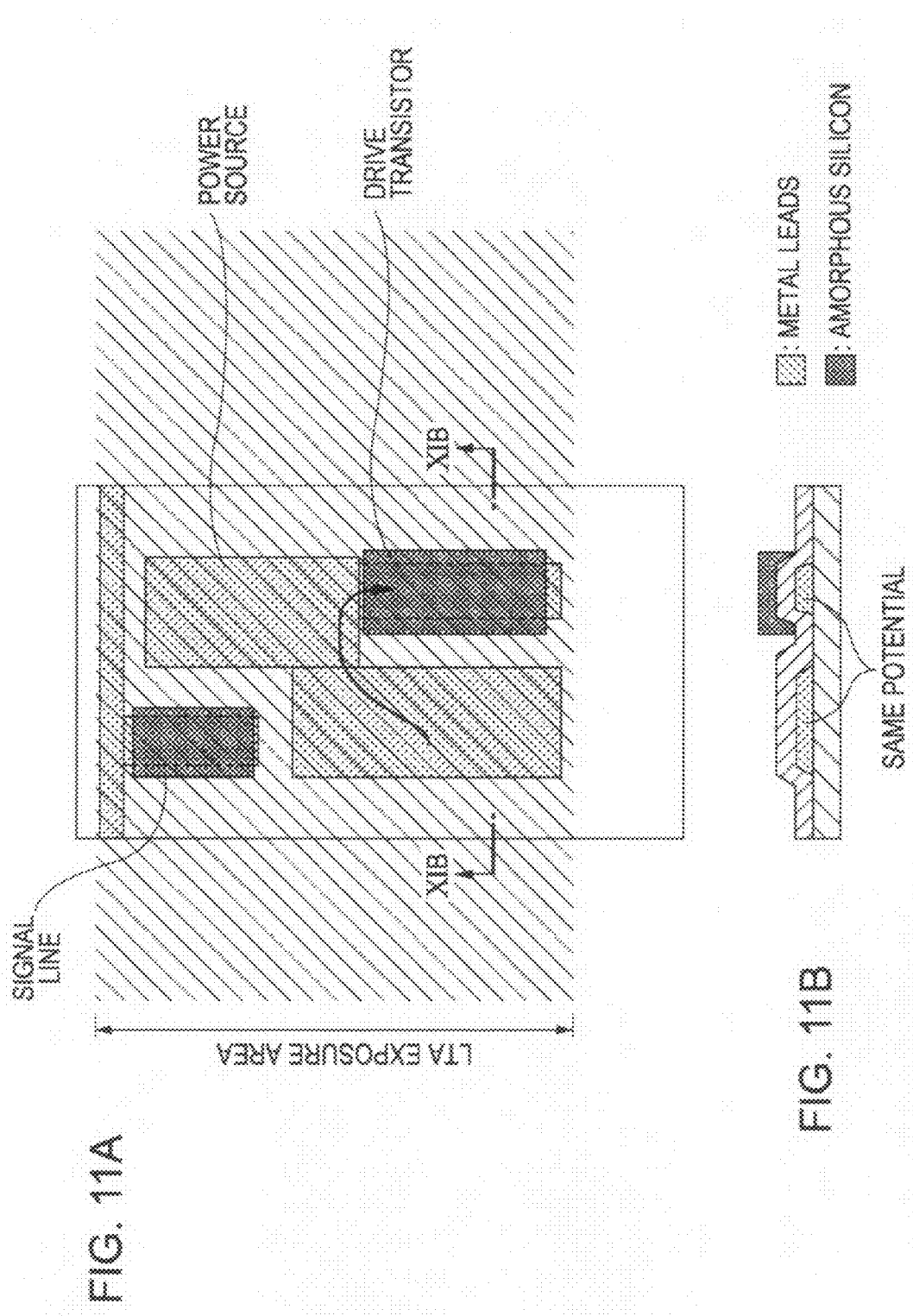

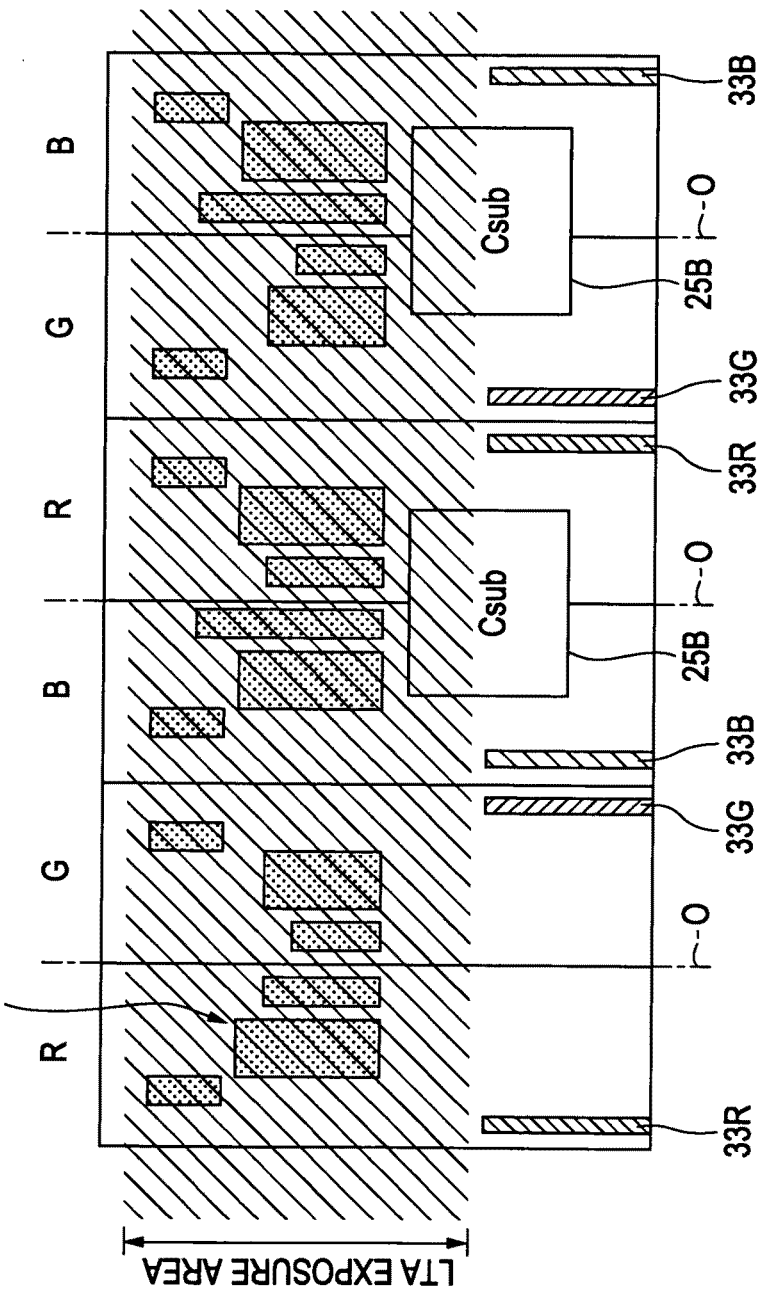

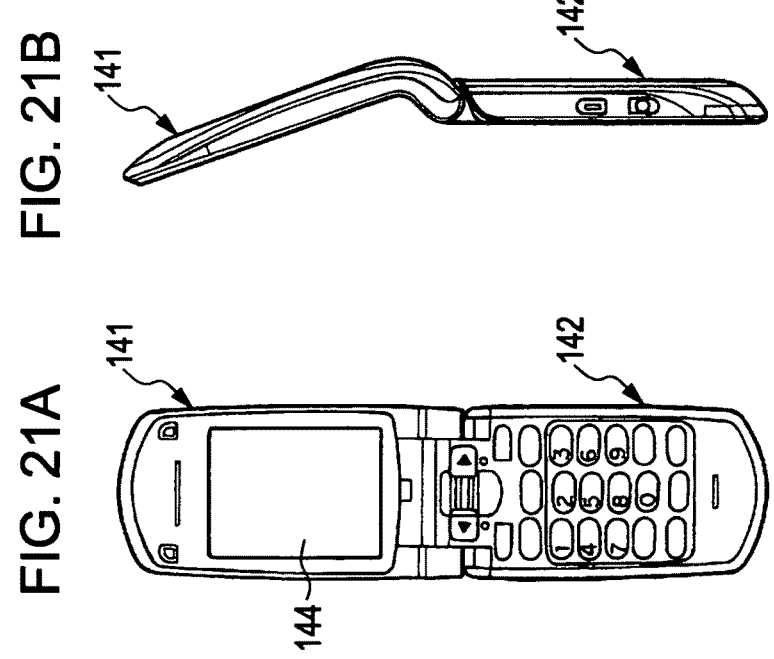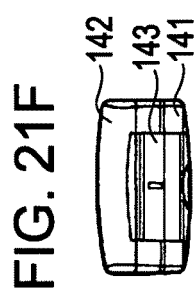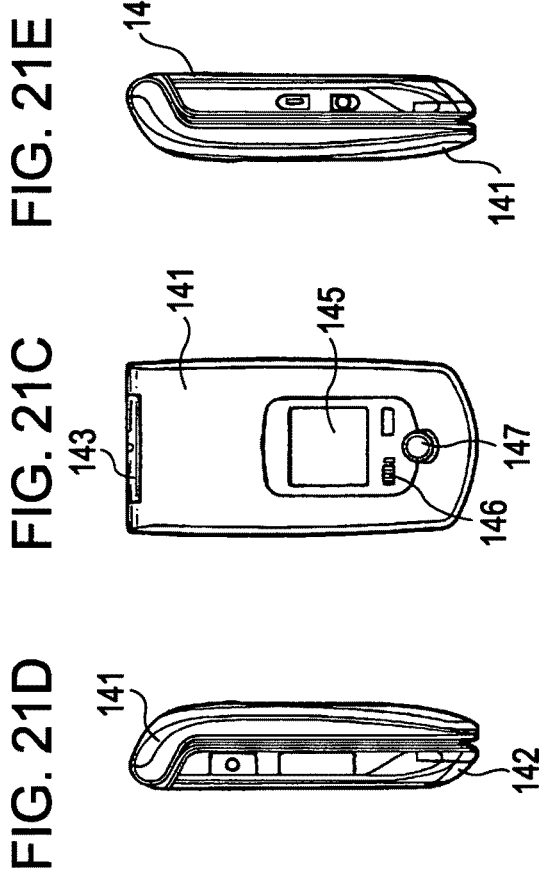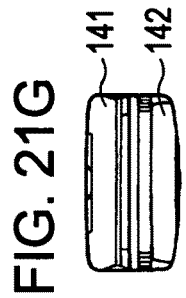

DISPLAY APPARATUS, PIXEL LAYOUT METHOD FOR DISPLAY APPARATUS, AND ELECTRONIC DEVICE

BACKGROUND OF THE INVENTION

1. Field of the Invention

The present invention relates to a display apparatus, a pixel layout method for a display apparatus, and an electronic device. More particularly, the present invention relates to: a planar (i.e., flat panel) display apparatus wherein pixels having electro-optical elements are arranged in a two-dimensional array, a pixel layout method for such a display apparatus, and an electronic device including such a display apparatus.

2. Description of the Related Art

Recently, the field of display apparatus for displaying images has seen rapid uptake of planar display apparatus, wherein pixels having light-emitting elements (hereinafter also referred to as to pixel circuits) are arranged in a two-dimensional array. In one such type of planar display apparatus, current-driven electro-optical elements are used as the light-emitting elements of the pixels. In other words, the luminous intensity of these elements changes according to the value of current flowing into the device. One example of such current-driven electro-optical elements is organic EL (electro luminescence) elements, which utilize the phenomenon of light emission as a result of applying an electric field to an organic thin film.

Organic EL display apparatus using organic EL elements as light-emitting elements have the following advantages. Since organic EL elements can be driven with applied voltages of 10 V or less, power consumption is low. Since organic EL elements are self-luminous, image visibility is higher compared to that of a liquid crystal display apparatus that displays images by controlling, on a per-pixel basis, the luminous intensity of light from a light source passing through liquid crystals. Moreover, since the backlight or similar light source can be omitted, it is easy to make organic EL display apparatus lighter and thinner. Furthermore, the response time of organic EL elements is very fast, on the order of several microseconds. For this reason, ghosting does not occur when displaying video.

Similarly to liquid crystal display apparatus, organic EL display apparatus may adopt a simple (passive) matrix system or an active matrix system as the driving system. However, while passive-matrix display apparatus are simple in construction, the light-emitting period of the electro-optical elements decreases with increases in the number of scan lines (i.e., the number of pixels), making it difficult to realize display apparatus that are both large and high-definition.

Consequently, development of active-matrix display apparatus is currently popular. In an active-matrix display apparatus, current flowing into each electro-optical element is controlled by an active element (such as an insulated-gate field-effect transistor, for example) provided within the same pixel as the given electro-optical element. Typically, a thin film transistor (TFT) is used as the insulated-gate field-effect transistor. In active-matrix display apparatus, the electro-optical elements maintain light emission for the duration of a single frame. For this reason, it is easy to realize large, high-definition displays.

In an active-matrix organic EL display apparatus, each pixel (i.e., pixel circuit) is configured to at least include a drive transistor, a write transistor, and a hold capacitor as the driving circuit of the organic EL element (see, for example, Japanese Unexamined Patent Application Publication No. 2005-345722). The drive transistor current-drives the organic EL element. The write transistor samples a picture signal and writes within the pixel. The hold capacitor holds the picture signal written by the write transistor.

Meanwhile, display apparatus are undergoing increases in definition and decreases in power consumption in recent years. As the definition of display apparatus increases, the size of each organic EL element decreases, which also results in smaller capacitance values for the parasitic capacitance of each organic EL element. In addition, as the power consumption of a display apparatus is decreased, the amplitude of the picture signals written to the pixels is designed to be lower.

During a picture signal write operation performed by the write transistor, when the gate potential Vg of the drive transistor rises due to writing the picture signal, the source voltage Vs of the drive transistor also rises, due to coupling between the hold capacitor and the parasitic capacitance of the organic EL element. The amount of increase $\Delta Vs$ in the source voltage at this point can be expressed as $$\Delta Vs = \Delta Vg \times \{Ccs/(Ccs+Cel)\} \quad (1)$$

where $\Delta Vg$ is the amount of increase in the gate potential, Ccs is the capacitance value of the hold capacitor, and Cel is the capacitance value of the parasitic capacitance of the organic EL element.

Pixel miniaturization as a result of increasing the definition of a display apparatus causes the capacitance value Cel of the parasitic capacitance of the organic EL element to decrease. As the above Eq. 1 demonstrates, if the capacitance value Cel decreases, then the amount of increase $\Delta Vs$ in the source voltage of the drive transistor also increases. Consequently, the driving voltage of the drive transistor (i.e., the gate-to-source voltage Vgs) decreases. As a result, a luminous intensity corresponding to the amplitude of the input picture signal is not obtained. Although the decrease in luminous intensity can be counteracted by increasing the amplitude of the picture signal, doing so impedes the lowering of power consumption in the display apparatus.

The foregoing thus describes an existing problem, taking by way of example the case where organic EL elements are used as the electro-optical elements. However, the above problem is not limited to organic EL elements, and can be said to apply generally to electro-optical elements having parasitic capacitances.

In order to compensate for insufficient parasitism in an electro-optical element, configurations have been adopted wherein an auxiliary capacitor is added between the anode of the electro-optical element (i.e., the source electrode of the drive transistor) and a fixed potential node (see, for example, Japanese Unexamined Patent Application Publication No. 2008-051990). This auxiliary capacitor compensates for insufficient capacitance in the electro-optical element, even for small capacitance values for the parasitic capacitance of the electro-optical element. In so doing, the auxiliary capacitor acts to suppress rises in the source voltage Vs of the drive transistor when writing signals. As a result of the action of the auxiliary capacitor, the driving voltage of the drive transistor can be secured without increasing the amplitude of the picture signal.

SUMMARY OF THE INVENTION

Meanwhile, the luminous efficiency of an organic EL element depends on the emitted color, due to organic materials and other factors. For this reason, the size of the drive transistor driving the organic EL element (i.e., the driving performance) and the driving current depend on the emitted color of the organic EL element. Consequently, the capacitance value of the auxiliary capacitor added to a pixel also depends on the emitted color of the organic EL element.

As one example, consider the case of a single pixel that acts as one unit for forming a color image, being made up of three sub-pixels R (red), G (green), and B (blue). In this example, if it is assumed that the film of the organic material for the B organic EL element is typically thicker than that of the organic EL elements for the other colors, then the luminous efficiency of the B organic EL element will be small compared to that of the organic EL elements for the other colors. For this reason, the capacitance value of the auxiliary capacitor for the B sub-pixel is made to be the largest.

In addition, as the size of display apparatus continues to increase, the planar area of each organic EL element becomes correspondingly larger, which magnifies the size differences among the parasitic capacitances for each emitted color. Consequently, the size of the auxiliary capacitor added to the B sub-pixel in the above example becomes very large. When creating this auxiliary capacitor, it is possible to design a pixel layout that is line-symmetric for two adjacent pixels (i.e., sub-pixels) in the pixel layout direction (i.e., horizontally) on a pixel row. By means of such a pixel layout, it becomes possible to create the auxiliary capacitor straddling both pixels and also existing in the adjacent pixel region (further details will be given later). In so doing, a large auxiliary capacitor can be laid out.

Also, as shown in FIG. 10, when large-sized auxiliary capacitors 25B for the B sub-pixels are formed extending into the adjacent pixel region, the auxiliary capacitors 25B are formed straddling the boundary between a B sub-pixel and an R sub-pixel, as well as between a B sub-pixel and a G sub-pixel. However, an auxiliary capacitor 25B is not formed between adjacent R and G sub-pixels. When just viewing the R sub-pixels or the G sub-pixels in the layout shown in FIG. 10, the presence and absence of a metal layer forming the auxiliary capacitor 25B occurs in each line.

For this reason, during a laser annealing step to be hereinafter described, heat transfer to the amorphous silicon on the TFT differs according to the presence or absence of the metal pattern for the auxiliary capacitor 25B, which causes the TFT characteristics to become non-uniform. As a result, striping occurs in each line, which causes the image quality of displayed images to suffer.

Consequently, it is desirable to provide a display apparatus wherein TFT characteristics can be made uniform using laser annealing in a pixel layout having auxiliary capacitors formed straddling two adjacent pixels. It is furthermore desirable to provide a pixel layout method for such a display apparatus, as well as an electronic device including such a display apparatus.

A display apparatus in accordance with an embodiment of the present invention includes a plurality of pixels disposed in an array. Each pixel includes: an electro-optical element; a write transistor configured to write a picture signal; a drive transistor configured to drive the electro-optical element according to the picture signal written by the write transistor; a hold capacitor, connected between the gate and source electrodes of the drive transistor, and configured to hold the picture signal written by the write transistor; and an auxiliary capacitor connected between the anode of the electro-optical element and a fixed potential node. In the display apparatus, an auxiliary capacitor is formed straddling the boundary between specific pixel pairs that are adjacent in the pixel layout direction on a pixel row. In addition, an island metal pattern is formed at a site corresponding to that of the auxiliary capacitor at the boundary between pixel pairs other than the specific pixel pairs.

In the case where an auxiliary capacitor is formed straddling the boundary between two pixels, an island metal pattern is formed at a site corresponding to that of the auxiliary capacitor, but at the boundary between pixel pairs other than the specific pixel pairs. Consequently, a metal pattern corresponding to an auxiliary capacitor exists at the boundary between any two pixels. In so doing, heat transfer to the amorphous silicon on the TFT is uniform during laser annealing, thereby enabling TFT characteristics can be made uniform using laser annealing.

According to an embodiment of the present invention, in the case where an auxiliary capacitor is formed straddling the boundary between two pixels, TFT characteristics can be made uniform using laser annealing. For this reason, uniform image quality without striping can be obtained.

BRIEF DESCRIPTION OF THE DRAWINGS

FIG. 3 is a cross-section diagram illustrating an exemplary cross-sectional structure of a pixel;

FIG. 4 is a timing waveform diagram accompanying explanation of circuit operation in an organic EL display apparatus in accordance with the basic example;

FIG. 10 illustrates the basic shape of a pixel layout;

FIG. 11A is a plan view illustrating a pixel layout when performing laser annealing;

FIG. 11B is a cross-section view of FIG. 11A;

FIG. 12 illustrates the layout of metal leads during laser annealing, in the case of the pixel layout shown in FIG. 10;

FIG. 21A illustrates a front exterior view of a mobile phone handset in the open state, and to which an embodiment of the present invention has been applied;

FIG. 21B illustrates a side view of FIG. 21A;

FIG. 21C illustrates a front exterior view of a mobile phone handset in the closed state, and to which an embodiment of the present invention has been applied;

FIG. 21D illustrates a left side view of FIG. 21C;

FIG. 21E illustrates a right side view of FIG. 21C;

FIG. 21F illustrates a top view of FIG. 21C; and

FIG. 21G illustrates a bottom view of FIG. 21C.

DESCRIPTION OF THE PREFERRED EMBODIMENTS

Hereinafter, preferred embodiments of the present invention will be described in detail with reference to the accompanying drawings. The description will proceed as follows.

1. Organic EL display apparatus in accordance with basic example (2Tr pixel architecture)
2. First Embodiment (connecting other end of auxiliary capacitor to common power supply line)
3. Second Embodiment (connecting other end of auxiliary capacitor to power supply line on previous pixel row)
4. Modifications
5. Applications (electronic devices)

1. Basic Example

System Configuration

Figure 1:
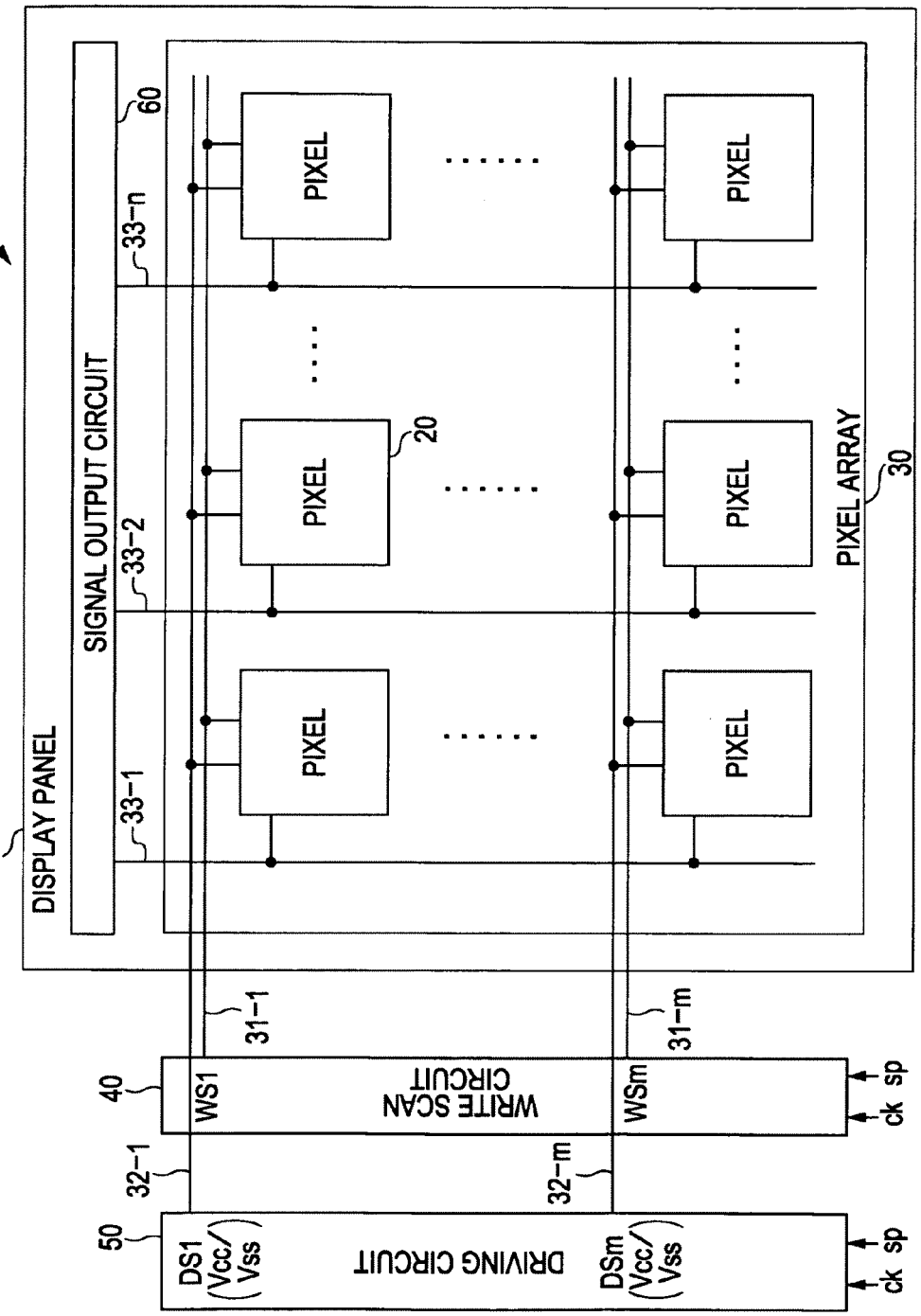
FIG. 1 is a system configuration diagram schematically illustrating the configuration of an organic EL display apparatus in accordance with a basic example of the present invention.

FIG. 1 is a system configuration diagram schematically illustrating the configuration of an active-matrix display apparatus in accordance with a basic example of the present invention. Herein, an active-matrix organic EL display apparatus is described by way of example, wherein the light-emitting element of the pixel (i.e., pixel circuit) used is an organic EL element. In other words, the light-emitting element in this example is a current-driven electro-optical element whose luminous intensity changes according to the value of current flowing into the device.

As shown in FIG. 1, the organic EL display apparatus 10 in accordance with the basic example includes: a plurality of pixels 20, each containing a light-emitting element; a pixel array 30, wherein the pixels 20 are two-dimensionally disposed in an array; and a drive unit disposed in the vicinity of the pixel array 30. The drive unit drives the emission of light from each pixel 20 in the pixel array 30.

The drive unit for the pixels 20 is made up of a scanning drive system and a signal supply system, for example. The scanning drive system includes a write scan circuit 40 and a driving circuit 50. The signal supply circuit includes a signal output circuit 60. In the case of a organic EL display apparatus 10 in accordance with the present application, the signal output circuit 60 is provided on a display panel 70 formed by the pixel array 30, while the write scan circuit 40 and the driving circuit 50 are both provided outside the display panel (substrate) 70.

In the case where the organic EL display apparatus 10 is configured for black and white display, the single pixels acting as units for forming black and white images correspond to the pixels 20. In contrast, in the case where the organic EL display apparatus 10 is configured to color display, the single pixels acting as units for forming color images are made up of a plurality of sub-pixels. In this case, the sub-pixels correspond to the pixels 20. More specifically, in a display apparatus for color display, a single pixel may be made up of three sub-pixels: a sub-pixel for emitting red (R) light, a sub-pixel for emitting green (G) light, and a sub-pixel for emitting blue (B) light, for example.

However, single pixels are not limited to being combinations of three primary color RGB sub-pixels. In other words, it is also possible to realize a single pixel by adding sub-pixels for one or more colors to the sub-pixels for the three primary colors. More specifically, a single pixel may be realized by adding a sub-pixel for emitting white (W) light in order to improve brightness. Alternatively, it is also possible to realize a single pixel by adding at least one other sub-pixel emitting a complementary color in order to expand the gamut of reproducible colors.

The pixel array 30 is made up of an array of pixels 20 in m rows and n columns. Along each row (i.e., the pixel row direction or horizontal direction) there extend scan lines 31-1 to 31-m and power supply (i.e., drive) lines 32-1 to 32-m to each pixel. Additionally, along each column (i.e., the pixel column direction or vertical direction) there extend signal lines 33-1 to 33-n to each pixel.

The scan lines 31-1 to 31-m are respectively connected to the output terminals of corresponding rows in the write scan circuit 40. The drive lines 32-1 to 32-m are respectively connected to the output terminals of corresponding rows in the driving circuit 50. The signal lines 33-1 to 33-n are respectively connected to the output terminals of corresponding columns in the signal output circuit 60.

The pixel array 30 is ordinarily formed on a transparent insulating substrate, such as a glass substrate. In so doing, the organic EL display apparatus 10 is realized in a planar (i.e., flat) panel structure. The driving circuit of each pixel 20 in the pixel array 30 may be formed using amorphous silicon TFT or low-temperature polysilicon TFT. When low-temperature polysilicon TFT is used, the write scan circuit 40 and the driving circuit 50 may also be incorporated onto the display panel 70.

The write scan circuit 40 is realized by means of a shift register or similar component that sequentially shifts (i.e., transfers) a start pulse sp in sync with a clock pulse ck. When writing a picture signal to each pixel 20 in the pixel array 30, the write scan circuit 40 sequentially scans each pixel 20 in the pixel array 30 on a per-row basis by sequentially supplying write scan signals WS (WS1 to WSm) to the scan lines 31-1 to 31-m (i.e., line-sequential scanning).

The driving circuit 50 is realized by means of a shift register or similar component that sequentially shifts a start pulse sp in sync with a clock pulse ck. Synched to the line-sequential scanning performed by the write scan circuit 40, the driving circuit 50 supplies power supply potentials (i.e., driving potentials) DS (DS1 to DSm) to the power supply lines 32-1 to 32-m. The driving potentials alternate between a first power supply potential Vcc, and a second power supply potential Vss that is lower than the first power supply potential Vcc. Light emission by the pixels 20 (i.e., emission or non-emission) is controlled as a result of the driving potentials. DS alternating between Vcc and Vss.

In accordance with intensity information supplied from a signal supply source (not shown in the drawings), the signal output circuit 60 suitably selects and outputs one of the following: a signal voltage Vsig of the picture signal (hereinafter also referred to simply as the signal voltage), or a reference potential Vofs. Herein, the reference potential Vofs selectively output from the signal output circuit 60 is a potential that acts as a reference for the signal voltage Vsig of the picture signal (such as a potential equivalent to the black level of the picture signal, for example).

The signal output circuit 60 may, for example, adopt a time-division driving circuit architecture. Time-division driving is also referred to as selector-based driving, and involves distributing a plurality of signal lines into units (groups) with respect to single output terminals in a driver (not shown in the drawings) that acts as the signal supply source. The plurality of signal lines are then sequentially selected in a time-division manner, while picture signals are output with respect to the selected signal lines in a time series via each output terminal in the driver. Each signal line is thus driven by supplying these picture signals distributed in a time-division manner.

Consider the case of color display by way of example, wherein a column of three adjacent pixels R, G, and B are taken to be a single unit, and wherein respective R, G, and B picture signals from the driver are input into the signal output circuit 60 in a time series during one horizontal period. The signal output circuit 60 is realized by means of a selector (i.e., a selecting switch) provided with respect to the column of three pixels R, G, and B. As a result of the selector sequentially performing switch-on operations in a time-division manner, respective R, G, and B picture signals are written to corresponding signal lines in a time-division manner.

Herein, a column (i.e., signal line) of three pixels R, G, and B is taken to be a single unit, but it should be appreciated that an embodiment of the present invention is not limited thereto. Additionally, implementing the above time-division driving method (i.e., selector-based driving) yields the advantage such that, if the time division is taken to be x (where x is an integer not less than 2), then the number of driver outputs as well as the number of leads between the driver and the signal output circuit 60 (and thus the display panel 70) can be reduced to 1/x times the number of signal lines.

The signal voltage Vsig or the reference potential Vofs selectively output from the signal output circuit 60 is written on a per-row basis to each pixel 20 in the pixel array 30 via the signal lines 33-1 to 33-n. In other words, the signal output circuit 60 implements a driving configuration for line-sequential writing, wherein the signal voltage Vsig is written on a per-row (i.e., per-line) basis.

(Pixel Circuit)

Figure 2:
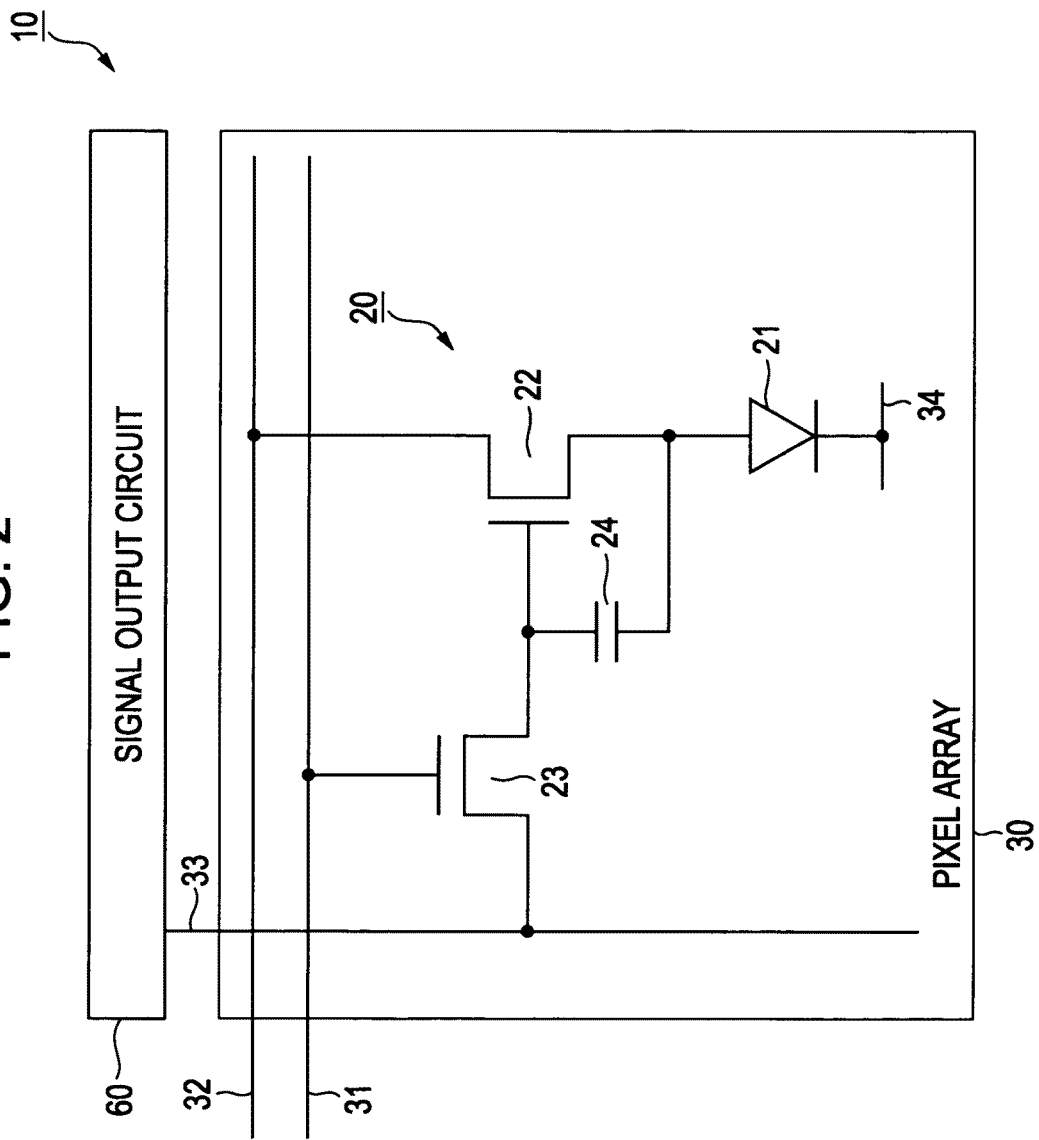
FIG. 2 is a circuit diagram illustrating a basic circuit configuration of a pixel.

FIG. 2 is a circuit diagram illustrating a specific exemplary configuration of a pixel (i.e., pixel circuit) 20 used in an organic EL display apparatus 10 in accordance with the basic example.

As shown in FIG. 2, the pixel 20 is realized by means of: a current-driven electro-optical element whose luminous intensity changes according to the value of current flowing into the device, such as an organic EL element 21; and a driving circuit that drives the organic EL element 21. The cathode of the organic EL element 21 is connected to a common power supply line 34 shared by all pixels 20 (i.e., a common line).

The driving circuit that drives the organic EL element 21 is configured to include a drive transistor 22, a write transistor (i.e., sampling transistor) 23, and a hold capacitor 24. Herein, the drive transistor 22 and the write transistor 23 may be realized by using N-channel TFTs. However, the above is merely one example of the possible combinations of conductive types for the drive transistor 22 and the write transistor 23, and an embodiment of the present invention is not limited thereto.

If N-channel TFTs are used for the drive transistor 22 and the write transistor 23, then amorphous silicon (a-Si) processes may be used. By using a-Si processes, it becomes possible to reduce the cost of the substrate used to create the TFT, and thus making it possible to potentially reduce the cost of the organic EL display apparatus 10. In addition, if a combination of the same conductive types is used for the drive transistor 22 and the write transistor 23, then both transistors 22 and 23 can be created on the same process, thereby contributing to cost reduction.

A first electrode (source or drain) of the drive transistor 22 is connected to the anode of the organic EL element 21, while the other electrode (drain or source) is connected to one of the drive lines 32 (32-1 to 32-m).

The gate of the write transistor 23 is connected to one of the scan lines 31 (31-1 to 31-m). Of the remaining electrodes, a first electrode (source or drain) is connected to one of the signal lines 33 (33-1 to 33-n), while the other electrode (drain or source) is connected to the gate of the drive transistor 22.

In the drive transistor 22 and the write transistor 23, the "first electrode" refers to a metal lead electrically connected to the source or drain region, while the "other electrode" refers to a metal lead electrically connected to the drain or source region. Furthermore, depending on the potential relationship between the first electrode and the other electrode, the first electrode may be a source or a drain electrode, while the other electrode may be a drain or a source electrode.

A first electrode of the hold capacitor 24 is connected to the gate of the drive transistor 22, while the other electrode is connected to both the other electrode of the drive transistor 22 as well as the anode of the organic EL element 21.

In a pixel 20 having the above configuration, the write transistor 23 switches to a conducting state in response to a High, active write scan signal WS applied to its gate from the write scan circuit 40 and via one of the scan lines 31. In so doing, the write transistor 23 samples and writes either the signal voltage Vsig of the picture signal or the reference potential Vofs to the pixel 20, in accordance with the intensity information supplied from the signal output circuit 60 via one of the signal lines 33. The signal voltage Vsig or the reference potential Vofs thus written is applied to the gate of the drive transistor 22, and is additionally held in the hold capacitor 24.

When the potential DS of one of the drive lines 32 (32-1 to 32-m) (hereinafter also referred to as the driving potential) is at the first power supply potential Vcc, the drive transistor 22 operates in the saturation region, with a first electrode becoming the drain, and the other electrode becoming the source. In so doing, the drive transistor 22 receives a supply of current from one of the drive lines 32 and drives the emission of light from the organic EL element 21 by current driving. More specifically, by operating in the saturation region, the drive transistor 22 supplies the organic EL element 21 with a driving current whose value is in accordance with the voltage value of the signal voltage Vsig being held in the hold capacitor 24. By current-driving the organic EL element 21 in this way, the organic EL element 21 is made to emit light.

Additionally, once the driving potential DS has switched from the first power supply potential Vcc to the second power supply potential Vss, the drive transistor 22 operates as a switching transistor, with the first electrode becoming the source, and the other electrode becoming the drain. By means of a switching operation, the drive transistor 22 suspends the supply of driving current to the organic EL element 21, which causes the organic EL element 21 to enter a non-emitting state. In other words, the drive transistor 22 also functions as a transistor that controls emission and non-emission of the organic EL element 21.

In this way, by means of switching operations of the drive transistor 22, there is provided a period during which the organic EL element 21 enters a non-emitting state (i.e., a non-emitting period), and furthermore, the ratio of the emitting periods and non-emitting periods of the organic EL element 21 is controlled (i.e., duty control is performed). Such duty control can be used to reduce ghosting that occurs when the pixel 20 emits light for an entire frame period, and thereby further improve the quality of video in particular.

Among the first and second power supply potentials Vcc and Vss that are selectively supplied from the driving circuit 50 via one of the drive lines 32, the first power supply potential Vcc is a power supply potential for supplying the drive transistor 22 with a driving current used to drive the emission of light from the organic EL element 21. The second power supply potential Vss is a power supply potential for applying a reverse bias to the organic EL element 21. The second power supply potential Vss is a potential lower than the reference potential Vofs that acts as the reference for the signal voltage Vsig. For example, if Vth is taken to be the threshold voltage of the drive transistor 22, then the second power supply potential Vss may be set to be lower than Vofs−Vth, and preferably significantly lower than Vofs−Vth.

(Pixel Structure)

FIG. 3 is a cross-section diagram illustrating an exemplary cross-sectional structure of a pixel 20. As shown in FIG. 3, in the pixel 20, a driving circuit including a drive transistor 22 is formed on a glass substrate 201. More specifically, an insulating film 202, an insulating flattening film 203, and a wind insulating film 204 are formed on the glass substrate 201 in that order, and the organic EL element 21 is provided in a depression 204A of the wind insulating film 204. Among the respective component elements of the driving circuit, only the drive transistor 22 is illustrated in FIG. 3, and the other component elements have been omitted.

The organic EL element 21 includes: an anode 205 made of metal or similar material; an organic layer 206 formed on top of the anode 205; and a cathode 207 made of a transparent conducting film or similar material, formed on top of the organic layer 206, and shared by all pixels. The anode 205 is formed on the floor of the depression 204A of the wind insulating film 204.

In the organic EL element 21, the organic layer 206 is formed by sequentially depositing the following onto the anode 205: a hole transport/injection layer 2061, a luminescent layer 2062, an electron transport layer 2063, and an electron injection layer (not shown in the drawings). Subsequently, current driving by the drive transistor 22 shown in FIG. 2 is used to cause current to flow from the drive transistor 22 to the organic layer 206 via the anode 205. Doing so causes the emission of light when electrons and holes are rejoined in the luminescent layer 2062 inside the organic layer 206.

The drive transistor 22 includes: a gate electrode 221: a channel formation region 225 that faces the gate electrode 221 of a semiconductor layer 222; and drain/source regions 223 and 224 on either side of the channel formation region 225 in the semiconductor layer 222. The source/drain region 223 is electrically connected to the anode 205 of the organic EL element 21 via a contact hole.

Also, as shown in FIG. 3, the organic EL element 21 is formed as a pixel unit via the insulating film 202, the insulating flattening film 203, and the wind insulating film 204 on the glass substrate 201, upon which is also formed the driving circuit including the drive transistor 22. Thereafter, a seal substrate is joined by an adhesive 210 and via a passivation layer 208. By sealing the organic EL element 21 by means of the seal substrate 209, the display panel 70 is formed.

Circuit Operation of Organic EL Display Apparatus in Accordance with Basic Example Circuit operation of the organic EL display apparatus 10 in accordance with the basic example will now be described with reference to FIGS. 5A to 6D on the basis of the timing waveform chart shown in FIG. 4.

In order to simplify illustration, the write transistor 23 is shown as a switch symbol in FIGS. 5A to 6D. Furthermore, it should also be appreciated as obvious that the organic EL element 21 has an equivalent capacitance (i.e., parasitic capacitance) Cel. Consequently, the equivalent capacitance Cel is also shown herein as a capacitor.

The timing waveform chart shown in FIG. 4 illustrates change in the potential WS of a scan line 31 (i.e., the write scan signal), the potential DS of a drive line 32 (i.e., the drive potential), the potential of a signal line 33 (Vofs/Vsig), and the gate voltage Vg and the source voltage Vs of the drive transistor 22.

(Emission Period of Previous Frame)

In the timing waveform chart shown in FIG. 4, the period prior to the time t1 is the emission period of the organic EL element 21 in the previous frame (or field). During this emission period of the previous frame, the potential DS of the drive line 32 is at the first power supply potential Vcc (hereinafter referred to as the high potential), while the write transistor 23 is in a non-conducting state.

Figure 5A:
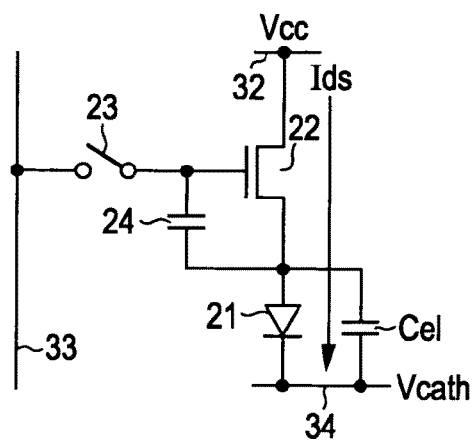
FIG. 5A is a diagram accompanying explanation of circuit operation in an organic EL display apparatus in accordance with the basic example.

The drive transistor 22 herein is designed to operate in the saturation region. Thus, as shown in FIG. 5A, a driving current (i.e., a drain-to-source current) Ids is supplied to the organic EL element 21 from one of the drive lines 32 via the drive transistor 22. The magnitude of this driving current Ids depends on the gate to source voltage Vgs of the drive transistor 22. Consequently, the organic EL element 21 emits light whose intensity depends on the current value of the driving current Ids.

(Threshold Correction Preparation Period)

Figure 5B:
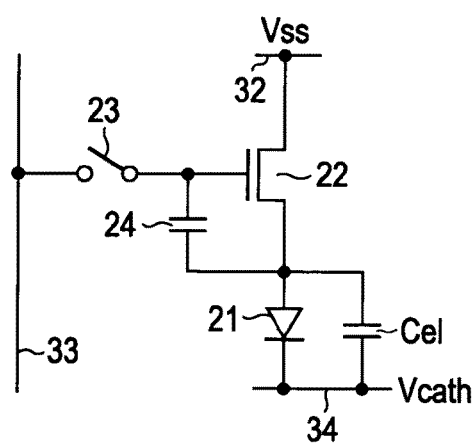
FIG. 5B is a diagram accompanying explanation of circuit operation in an organic EL display apparatus in accordance with the basic example.

Upon reaching time t1, the system enters a new frame of the sequential line scanning (i.e., the current frame). As shown in FIG. 5B, the potential DS of one of the drive lines 32 switches from the high potential Vcc to the second power supply potential Vss (hereinafter referred to as the low potential). With respect to the reference potential Vofs of one of the signal lines 33, the low potential Vss is significantly lower than Vofs−Vth.

Herein, the threshold voltage of the organic EL element 21 is taken to be Vthel, while the potential of the common power supply line 34 (i.e., the cathode potential) is taken to be Vcath. At this point, if the low potential Vss is taken to be such that Vss<Vthel+Vcath, then the source potential Vs of the drive transistor 22 becomes approximately equal to the low potential Vss, and thus the organic EL element 21 enters a reverse bias state. Consequently, the organic EL element 21 ceases light emission.

Figure 5C:
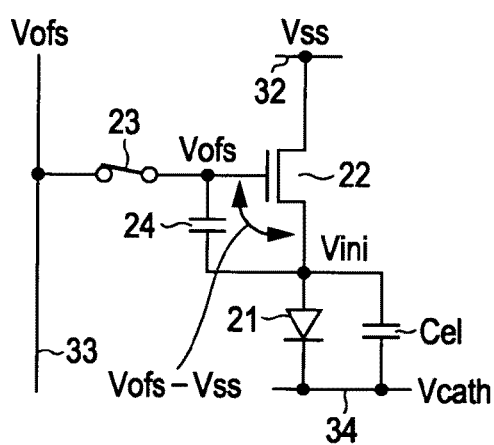
FIG. 5C is a diagram accompanying explanation of circuit operation in an organic EL display apparatus in accordance with the basic example.

Next, the potential WS of one of the scan lines 31 transitions from low potential to high potential at time t2, causing the write transistor 23 to enter a conducting state, as shown in FIG. 5C. At this point, since the reference potential Vofs is supplied to one of the signal lines 33 from the signal output circuit 60, the gate voltage Vg of the drive transistor 22 becomes the reference potential Vofs. In addition, the source voltage Vs of the drive transistor 22 is at the potential Vss, significantly lower than the reference potential Vofs.

At this point, the gate-to-source voltage Vgs of the drive transistor 22 becomes Vofs−Vss. Herein, the threshold correction process to be hereinafter described is inhibited if Vofs−Vss is not greater than the threshold voltage Vth of the drive transistor 22. For this reason, it is preferable to set the potential relationship such that Vofs−Vss>Vth.

In this way, the gate voltage Vg of the drive transistor 22 is fixed at (i.e., defined to be) the reference potential Vofs, while the source voltage Vs is fixed at the low potential Vss. This voltage initialization process is a preparatory process executed before the threshold correction process to be hereinafter described (i.e., threshold correction preparation). Consequently, the reference potential Vofs and the low potential Vss become the respective initial potentials for the gate voltage Vg and the source voltage Vs of the drive transistor 22.

(Threshold Correction Period)

Figure 5D:
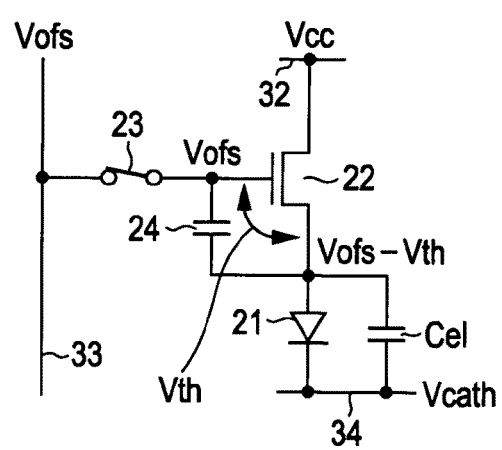
FIG. 5D is a diagram accompanying explanation of circuit operation in an organic EL display apparatus in accordance with the basic example.

Next, when the potential DS of one of the drive lines 32 switches from the low potential Vss to the high potential Vcc at the time t3, a threshold correction process is initiated with the gate voltage Vg of the drive transistor 22 in a held state, as shown in FIG. 5D. In other words, the source voltage Vs of the drive transistor 22 starts to rise to approach a potential equal to that obtained by subtracting the threshold voltage Vth of the drive transistor 22 from the gate voltage Vg.

In summary, using the initial potential Vofs of the gate voltage Vg of the drive transistor 22 as a reference, the source voltage Vs is varied to approach a potential equal to that obtained by subtracting the threshold voltage Vth of the drive transistor 22 from this initial potential Vofs. This process is herein referred to as the threshold correction process. As the threshold correction process proceeds, the gate-to-source voltage Vgs of the drive transistor 22 eventually converges at the threshold voltage Vth of the drive transistor 22. This voltage equivalent to the threshold voltage Vth is held in the hold capacitor 24.

During the period of conducting the threshold correction process (i.e., the threshold correction period), current should flow entirely to the hold capacitor 24, and not flow to the organic EL element 21. In order to achieve this, the potential Vcath of the common power supply line 34 is set such that the organic EL element 21 enters a cutoff state.

Figure 6A:
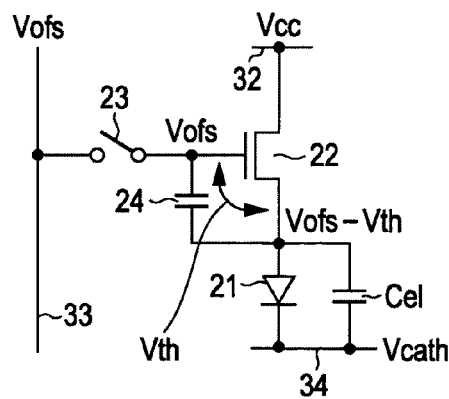
FIG. 6A is a diagram accompanying explanation of circuit operation in an organic EL display apparatus in accordance with the basic example.

Next, the potential WS of one of the scan lines 31 transitions to low potential at the time t4, which causes the write transistor 23 to enter a non-conducting state, as shown in FIG. 6A. At this point, the gate electrode of the drive transistor 22 enters a floating state as a result of being electrically decoupled from one of the signal lines 33. However, since the gate-to-source voltage Vgs is equal to the threshold voltage Vth of the drive transistor 22, the drive transistor 22 enters a cutoff state. Consequently, the drain-to-source current Ids does not flow in the drive transistor 22.

(Signal Writing and Mobility Correction Period)

Figure 6B:
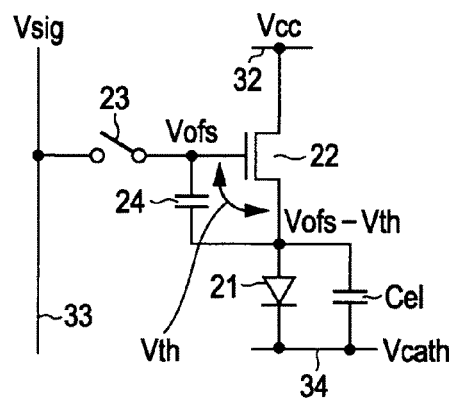
FIG. 6B is a diagram accompanying explanation of circuit operation in an organic EL display apparatus in accordance with the basic example.
Figure 6C:
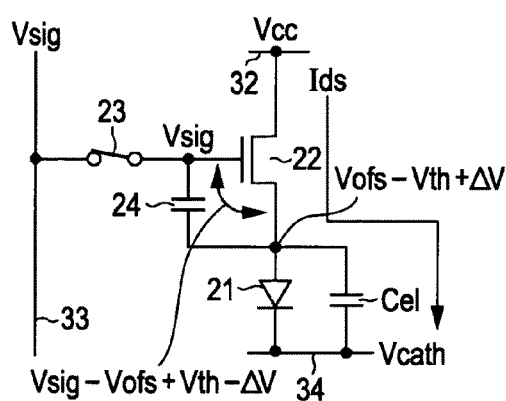
FIG. 6C is a diagram accompanying explanation of circuit operation in an organic EL display apparatus in accordance with the basic example.

Next, as shown in FIG. 6B, the potential of one of the signal lines 33 switches from the reference potential Vofs to the signal voltage Vsig of the picture signal at the time t5. Subsequently, the potential WS of one of the scan lines 31 transitions to high potential at the time t6. As shown in FIG. 6C, this causes the write transistor 23 to enter a conducting state, sample the signal voltage Vsig of the picture signal, and write the signal voltage Vsig inside the pixel 20.

As a result the write transistor 23 writing the signal voltage Vsig, the gate voltage Vg of the drive transistor 22 becomes the signal voltage Vsig. Additionally, when driving the drive transistor 22 with the signal voltage Vsig of the picture signal, the threshold voltage Vth of the drive transistor 22 is canceled out with a voltage equivalent to the threshold voltage Vth held in the hold capacitor 24. The principle behind this threshold canceling will be later described in detail.

At this point, the organic EL element 21 is in a cutoff state (i.e., a high impedance state). Consequently, the current flowing from one of the drive lines 32 to the drive transistor 22 in accordance with the signal voltage Vsig of the picture signal (i.e., the drain-to-source current Ids) flows into the equivalent capacitor Cel of the organic EL element 21. The equivalent capacitor Cel of the organic EL element 21 thus begins to be charged by the drain-to-source current Ids.

As a result of charging the equivalent capacitor Cel, the source voltage Vs of the drive transistor 22 rises with passing time. At this point, per-pixel fluctuations in the threshold voltage Vth of the drive transistor 22 have already been canceled out, and the drain-to-source current Ids of the drive transistor 22 becomes dependent on the mobility μ of the drive transistor 22. Herein, the mobility μ is the electron mobility in the semiconducting thin film constituting the channel of the drive transistor 22.

At this point, assume that the ratio of the held voltage Vgs in the hold capacitor 24 with respect to the signal voltage Vsig of the picture signal is 1 (i.e., the ideal value). This ratio of the held voltage Vgs versus the signal voltage Vsig is also referred to as the write gain in some cases. Assuming the above ratio, if the source voltage Vs of the drive transistor 22 rises to a potential Vofs−Vth+ΔV, then the gate-to-source voltage Vgs of the drive transistor 22 becomes Vsig−Vofs+Vth−ΔV.

In other words, the voltage rise ΔV of the source voltage Vs of the drive transistor 22 is deducted from the voltage held in the hold capacitor 24 (Vsig−Vofs+Vth). Stated differently, the rise ΔV in the source voltage Vs works to discharge the accumulated charge in the hold capacitor 24, such that negative feedback is applied. Consequently, the rise ΔV in the source voltage Vs of the drive transistor 22 becomes the magnitude of the negative feedback.

In this way, dependency on the mobility μ of the drain-to-source current Ids of the drive transistor 22 can be counteracted by applying to the gate-to-source voltage Vgs negative feedback of magnitude ΔV in accordance with the drain-to-source current Ids flowing into the drive transistor 22. This process for counteracting the dependency on the mobility μ is a mobility correction process that corrects per-pixel fluctuations in the mobility μ of the drive transistor 22.

More specifically, the drain-to-source current Ids increases with higher signal amplitudes Vin (Vin=Vsig−Vofs) of the picture signal written to the gate electrode of the drive transistor 22. For this reason, the absolute value of the negative feedback ΔV also increases. Consequently, the mobility correction process is conducted in accordance with the emission intensity level.

In addition, in the case where the signal amplitude Vin of the picture signal is constant, the absolute value of the negative feedback ΔV increases with increasing mobility μ of the drive transistor 22. For this reason, per-pixel fluctuations in the mobility μ can be eliminated. Consequently, the magnitude ΔV of the negative feedback can also be said to be the magnitude of the mobility correction. The principle behind mobility correction will be later described in detail.

(Emission Period)

Figure 6D:
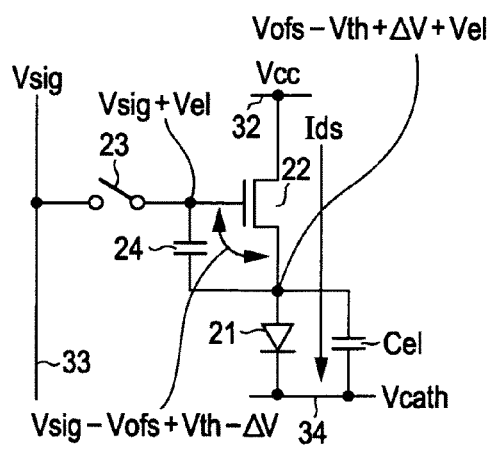
FIG. 6D is a diagram accompanying explanation of circuit operation in an organic EL display apparatus in accordance with the basic example.

Next, as shown in FIG. 6D, the potential WS of one of the scan lines 31 transitions to low potential at the time t7, which causes the write transistor 23 to enter a non-conducting state. As a result, the gate electrode of the drive transistor 22 enters a floating state due to be electrically decoupled from one of the signal lines 33.

Herein, when the gate electrode of the drive transistor 22 is in a floating state, variation in the gate voltage Vg is linked to (i.e., subject to) variation in the source voltage Vs of the drive transistor 22. This linkage occurs because the hold capacitor 24 is connected between the gate and source of the drive transistor 22. In this way, the operation whereby variation in the gate voltage Vg of the drive transistor 22 is linked to variation in the source voltage Vs is referred to as a bootstrap operation by the hold capacitor 24 in the present specification.

At the same time that the gate electrode of the drive transistor 22 enters a floating state, the drain-to-source current Ids of the drive transistor 22 begins to flow to the organic EL element 21. This causes the anode of the organic EL element 21 to rise in accordance with the drain-to-source current Ids.

Subsequently, once the anode potential of the organic EL element 21 exceeds Vthel+Vcath, the organic EL element 21 initiates light emission, because driving current has begun to flow into the organic EL element 21. Moreover, the rise in the anode potential of the organic EL element 21 is precisely the rise in the source voltage Vs of the drive transistor 22. If the source voltage Vs of the drive transistor 22 rises, then bootstrap operation of the hold capacitor 24 causes the linked gate voltage Vg of the drive transistor 22 to also rise.

If it is assumed at this point that the bootstrap gain is 1 (i.e., the ideal value), then the rise in the gate voltage Vg will become equal to the rise in the source voltage Vs. Thus, the gate-to-source voltage Vgs of the drive transistor 22 during the emission period will be held constant at Vsig−Vofs+Vth−ΔV. Subsequently, the potential of one of the signal lines 33 will switch from the signal voltage Vsig of the picture signal to the reference potential Vofs at the time t8.

In the series of circuit operations described above, the threshold correction preparation, the threshold correction, the writing of the signal voltage Vsig (i.e., signal writing), and the mobility correction processing operations are each executed in one horizontal scanning period (1H). In addition, the signal writing and mobility correction processing operations are both executed in parallel during the period between times t6 and t7.

By way of example, the foregoing describes the case of implementing a driving method that executes the threshold correction process just once. However, the above driving method is merely one example, and an embodiment of the present invention is not limited to the above driving method. For example, it is also possible to implement a driving method that conducts segmented threshold correction. In other words, in addition to a 1H period wherein the both the mobility correction and signal writing processes are conducted, the threshold correction process may be plurally executed in a segmented manner over a plurality of horizontal scanning periods preceding the 1H period.

By implementing such a driving method with segmented threshold correction, sufficient time for the threshold correction period can be secured over a plurality of horizontal scanning periods, even if the time allotted to single horizontal scanning periods has been reduced as a result of an increase in the number of pixels due to increased definition. As a result, the threshold correction process can be reliably conducted.

(Threshold Canceling Principle)

The principle behind threshold correction of the drive transistor 22 (i.e., threshold canceling) will now be described. As described earlier, the threshold correction process involves using the initial potential Vofs of the gate voltage Vg of the drive transistor 22 as a reference to vary the source voltage Vs so as to approach a potential equal to that obtained by subtracting the threshold voltage Vth of the drive transistor 22 from this initial potential Vofs.

Since the drive transistor 22 is designed to operation in the saturation region, the drive transistor 22 operates as a fixed current source. By operating as a fixed current source, a constant drain-to-source current (i.e., driving current) Ids given by $$Ids=(1/2)\times\mu(W/L)Cox(Vgs-Vth)^2 \quad (2)$$

is supplied to the organic EL element 21 from drive transistor 22, where W is the channel width of the drive transistor 22, L is the channel length, and Cox is the gate capacitance per unit area.

Figure 7:
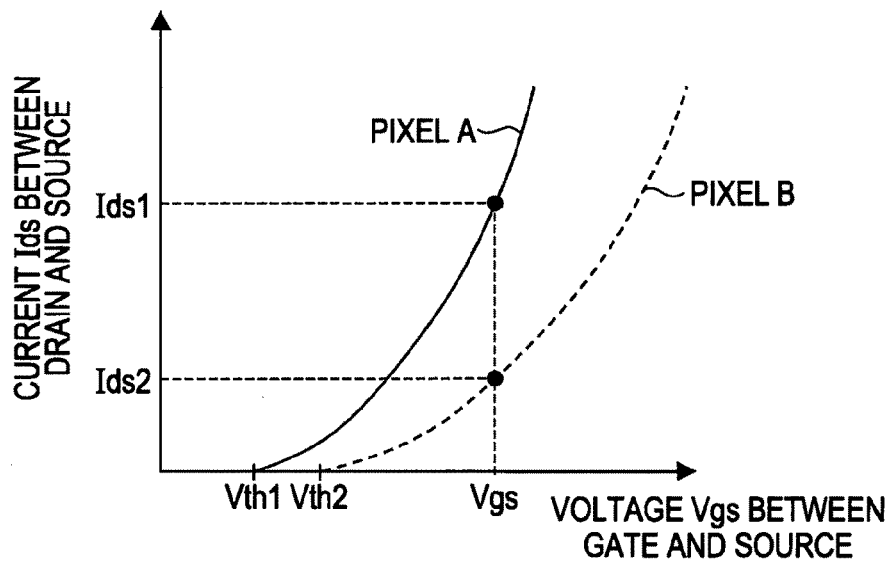
FIG. 7 is a graph accompanying explanation of a problem arising from fluctuations in the threshold voltage Vth of a drive transistor.

FIG. 7 is a plot of the gate-to-source voltage Vgs versus the drain-to-source current Ids of the drive transistor 22.

As shown in FIG. 7, if per-pixel fluctuations in the threshold voltage Vth of the drive transistor 22 are not corrected, then when the threshold voltage Vth is Vth1, the drain-to-source current Ids corresponding to the gate-to-source voltage Vgs becomes Ids1.

In contrast, when the threshold voltage Vth is Vth2 (where Vth2>Vth1), the drain-to-source current Ids corresponding to the same gate-to-source voltage Vgs becomes Ids2 (where Ids2<Ids). In other words, if the threshold voltage Vth of the drive transistor 22 is varied, then the drain-to-source current Ids also varies, even if the gate-to-source voltage Vgs of the drive transistor 22 stays constant.

Meanwhile, in the pixel (i.e., pixel circuit) 20 configured as described earlier, the gate-to-source voltage Vgs of the drive transistor 22 during emission is Vsig−Vofs+Vth−ΔV, as described earlier. For this reason, if the above gate-to-source voltage Vgs is substituted into Eq. 2, then the drain-to-source current Ids can be expressed as $$Ids=(1/2)\times\mu(W/L)Cox(Vsig-Vofs-\Delta V)^2 \quad (3)$$

In other words, the term expressing the threshold voltage Vth of the drive transistor 22 is canceled out, and thus the drain-to-source current Ids supplied to the organic EL element 21 from the drive transistor 22 does not depend on the threshold voltage Vth of the drive transistor 22. As a result, the drain-to-source current Ids does not vary, even in the event of per-pixel variation in the threshold voltage Vth of the drive transistor 22 due to fluctuations in manufacturing processes or time-based change in the drive transistor 22. For this reason, the intensity of emitted light from the organic EL element 21 can be held constant.

(Mobility Correction Principle)

Next, the principle behind correcting mobility in the drive transistor 22 will be described. As described earlier, the mobility correction process involves applying negative feedback to the potential difference between the gate and source of the drive transistor 22, with the magnitude $\Delta V$ of the mobility correction being in accordance with the drain-to-source current Ids flowing into the drive transistor 22. By means of this mobility correction process, dependency on the mobility $\mu$ of the drain-to-source current Ids of the drive transistor 22 can be counteracted.

Figure 8:
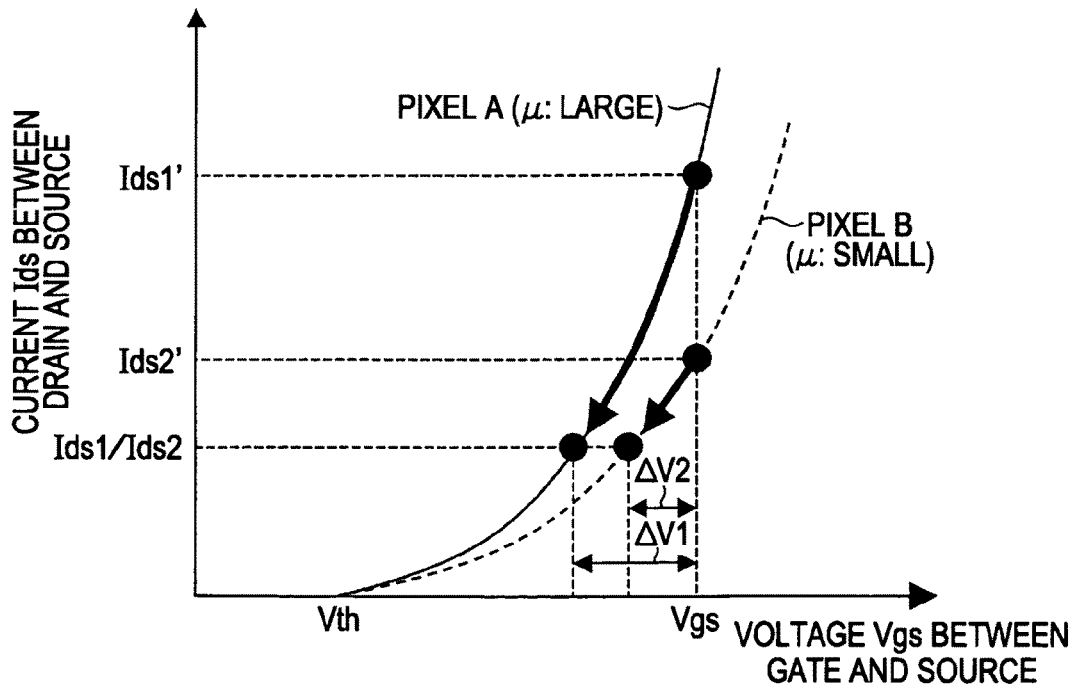
FIG. 8 is a graph accompanying explanation of a problem arising from fluctuations in the mobility μ of a drive transistor.

FIG. 8 is a curve plot comparing a pixel A, whose drive transistor 22 has a relatively large mobility $\mu$, to a pixel B, whose drive transistor 22 has a relatively small mobility $\mu$. In the case where each drive transistor 22 is realized using a polysilicon thin film transistor or similar material, fluctuations in the mobility $\mu$ among pixels like the above pixels A and B is expected.

Given such fluctuation between the mobility $\mu$ of the pixel A and the pixel B, consider the case where, for example, same-level signal amplitudes Vin (Vin=Vsig−Vofs) are respectively written to the gate electrode of the drive transistor 22 in both the pixel A and the pixel B. In this case, if the mobility $\mu$ is not corrected, then a large difference will develop between the drain-to-source current Ids1' flowing into the pixel A with the large mobility $\mu$, and the drain-to-source current Ids2' flowing into the pixel B with the small mobility $\mu$. If large inter-pixel differences in the drain-to-source current Ids develop due to per-pixel fluctuations in the mobility $\mu$ in this way, the uniformity of the screen is impaired.

As the transistor characteristics expressed in the preceding Eq. 2 demonstrate, the drain-to-source current Ids increases when the mobility $\mu$ is relatively large. Consequently, magnitude $\Delta V$ of the negative feedback increases as the mobility $\mu$ increases. As shown in FIG. 8, the feedback magnitude $\Delta V1$ of the pixel A with the relatively large mobility $\mu$ is greater than the feedback magnitude $\Delta V2$ of the pixel B with the relatively small mobility $\mu$.

Consequently, the mobility correction process is used to apply negative feedback to the gate-to-source voltage Vgs, wherein the feedback has a magnitude of $\Delta V$ in accordance with the drain-to-source current Ids of the drive transistor 22. In so doing, the applied negative feedback is large to the extent that the mobility $\mu$ is large. As a result, per-pixel fluctuations in the mobility $\mu$ can be suppressed.

More specifically, if correction with a feedback magnitude of $\Delta V1$ is applied with a to the pixel A with a large mobility $\mu$, then the drain-to-source current Ids falls significantly, from Ids' to Ids1. In contrast, since the feedback magnitude $\Delta V2$ is small for the pixel B with the small mobility $\mu$, the drain-to-source current Ids does not fall as significantly, falling from Ids2' to Ids2. The above results in the per-pixel fluctuations in the mobility $\mu$ being corrected such that the drain-to-source current Ids1 of the pixel A becoming approximately equal to the drain-to-source current Ids2 of the pixel B.

To summarize the above, given a pixel A and a pixel B with different values for the mobility $\mu$, the feedback magnitude $\Delta V1$ for the pixel A with the large mobility $\mu$ becomes larger than the feedback magnitude $\Delta V2$ for the pixel B with the small mobility $\mu$. In other words, the feedback magnitude $\Delta V$ increases in proportion with the mobility $\mu$, and thus the amount by which the drain-to-source current Ids is reduced also increases.

Consequently, by applying negative feedback to the gate-to-source voltage Vgs whose feedback magnitude $\Delta V$ varies in accordance with the drain-to-source current Ids of the drive transistor 22, the current value of the drain-to-source current Ids is made uniform for pixels with different mobility $\mu$. As a result, per-pixel fluctuations in the mobility $\mu$ can be corrected. In other words, the process of applying negative feedback to the gate-to-source voltage Vgs of the drive transistor 22 whose feedback magnitude $\Delta V$ varies in accordance with the drain-to-source current Ids of the drive transistor 22 is a mobility correction process.

Figure 9A:
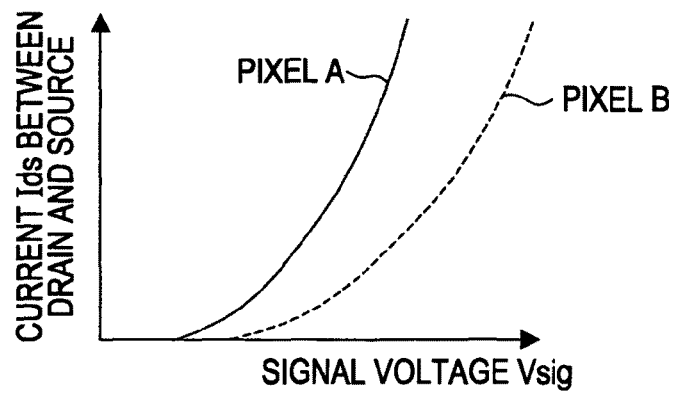
FIG. 9A is a graph accompanying explanation of the relationship between the signal voltage Vsig of a picture signal and the drain-to-source current Ids of a drive transistor, in the case where neither threshold correction nor mobility correction are performed.
Figure 9B:
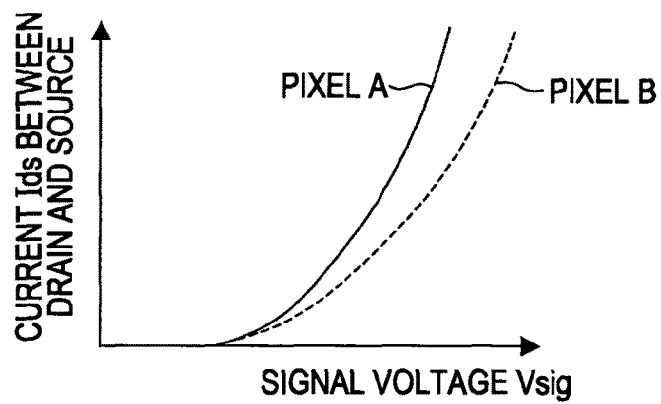
FIG. 9B is a graph accompanying explanation of the relationship between the signal voltage Vsig of a picture signal and the drain-to-source current Ids of a drive transistor, in the case where threshold correction is performed, but mobility correction is not performed.
Figure 9C:
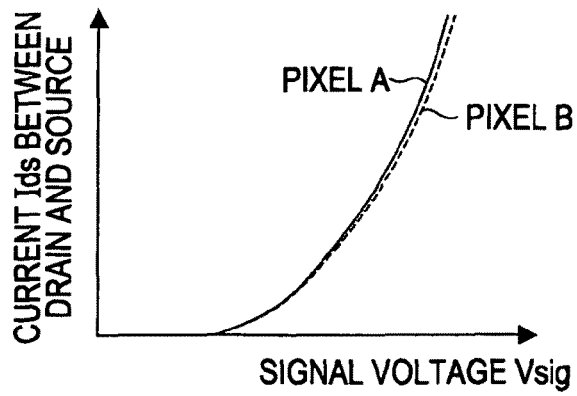
FIG. 9C is a graph accompanying explanation of the relationship between the signal voltage Vsig of a picture signal and the drain-to-source current Ids of a drive transistor, in the case where both threshold correction and mobility correction are performed.

FIGS. 9A to 9C will now be used to describe the relationship between the signal potential (i.e., the sampling potential) Vsig of the picture signal and the drain-to-source current Ids of the drive transistor 22 in the pixel (i.e., pixel circuit) 20 shown in FIG. 2, and with respect to whether or not threshold correction and mobility correction are performed.

FIG. 9A illustrates the case where neither the threshold correction process nor the mobility correction process is performed. FIG. 9B illustrates the case where the threshold correction process is performed, but the mobility correction process is not performed. FIG. 9C illustrates the case where both the threshold correction process and the mobility correction process are performed. As shown in FIG. 9A, in the case where neither the threshold correction process nor the mobility correction process is performed, a large difference in the drain-to-source current Ids develops between the pixels A and B, due to per-pixel fluctuations in both the threshold voltage Vth and the mobility $\mu$ in the pixels A and B.

As shown by way of contrast in FIG. 9B, in the case where only the threshold correction process is performed, fluctuations in the drain-to-source current Ids are reduced to some degree, but a difference in the drain-to-source current Ids still remains between the pixels A and B, due to per-pixel fluctuations in the mobility $\mu$ in the pixels A and B. However, as shown in FIG. 9C, performing both the threshold correction process and the mobility correction process almost completely eliminates the difference in the drain-to-source current Ids between the pixels A and B that is caused by per-pixel fluctuations in both the threshold voltage Vth and the mobility $\mu$ in the pixels A and B. Consequently, intensity fluctuations in the organic EL element 21 do not occur at any tone, and a display image with favorable image quality can be obtained.

In addition to the respective corrective functions for threshold correction and mobility correction, the pixel 20 shown in FIG. 2 is also provided with functions for bootstrap operation by the hold capacitor 24, as described earlier. As a result, the following advantage is achieved.

By means of bootstrap operation by the hold capacitor 24, the gate-to-source voltage Vgs of the drive transistor 22 can be maintained at a constant value, even if the source voltage Vs of the drive transistor 22 changes due to time-based change in the I-V characteristics of the organic EL element 21. Consequently, the current flowing into the organic EL element 21 becomes constant and unchanging. As a result, the emission intensity of the organic EL element 21 is held constant, thereby realizing an image display that does not exhibit brightness-related defects due to time-based change in the I-V characteristics of the organic EL element 21.

(Role of Auxiliary Capacitor)

In the pixel circuit shown in FIG. 2, the capacitance value of the hold capacitor 24 is taken to be Ccs, the capacitance value of the parasitic capacitance between the gate and the source of the drive transistor 22 is taken to be Cgs, and the capacitance value of the equivalent capacitor in the organic EL element 21 is taken to be Cel. The write gain G when writing the signal voltage Vsig of the picture signal is thus given by the following.

$$G=1-\{(Ccs+Cgs)/(Ccs+Cgs+Cel)\} \quad (4)$$

As the above Eq. 4 demonstrates, the write gain G approaches 1 (i.e., the ideal value) as the capacitance value Cel of the equivalent capacitor in the organic EL element 21 increases.

Meanwhile, there is recent tendency for the pixels 20 to become more and more miniaturized in order to achieve higher definition display apparatus. If pixel 20 is miniaturized, then the size of the organic EL element 21 also decreases. In so doing, the capacitance value Cel of the equivalent capacitor in the organic EL element 21 decreases. As a result, the write gain G decreases, as demonstrated by Eq. 4.

As described earlier, an auxiliary capacitor is added between the anode of the organic EL element 21 and a fixed potential node in order to compensate for insufficient capacitance in the organic EL element 21. By adding an auxiliary capacitor, the write gain G can be expressed as $$G=0.1-\{(Ccs+Cgs)/(Ccs+Cgs+Cel+Csub)\} \quad (5)$$

where Csub is the capacitance value of the auxiliary capacitor.

As the above Eq. 5 demonstrates, by adding an auxiliary capacitor between the anode of the organic EL element 21 and a fixed potential node, the write gain G can be increased, even for a small-size organic EL element 21. Moreover, by compensating for the insufficient capacitance in the organic EL element 21, the auxiliary capacitor acts to suppress rises in the source voltage Vs of the drive transistor 22 when writing the signal voltage Vsig of the picture signal.

As a result of the action of the auxiliary capacitor, amplitude loss in the signal voltage Vsig of the picture signal written to the hold capacitor 24 is eliminated. In other words, decreases in the gate-to-source voltage Vgs of the drive transistor 22 are eliminated, and the driving voltage of the drive transistor 22 is secured. The organic EL element 21 can thus be driven by a driving voltage in accordance with the amplitude of the signal voltage Vsig of the input picture signal. As a result, emitted light is obtained whose intensity corresponds to the amplitude of the signal voltage Vsig of the picture signal.

In addition, in the mobility correction process described earlier, the convergence voltage of the source voltage Vs of the drive transistor 22 is not constant, unlike that during the threshold correction process. This is because the gate voltage Vg of the drive transistor 22 is the signal voltage Vsig and the organic EL element 21 is made to operate at the threshold voltage Vthel or less during the mobility correction process. Given such circumstances, the mobility correction time is set to a short period. Meanwhile, in the threshold correction process, the convergence voltage of the source voltage Vs with respect to the initial voltage Vofs of the drive transistor 22 becomes a constant voltage lower than the initial voltage Vofs by the threshold voltage Vth of the drive transistor 22 (in other words, the convergence voltage becomes equal to Vofs−Vth).

The mobility correction process when displaying white will now be further considered. During the mobility correction period, the anode voltage of the organic EL element 21 (i.e., the source voltage Vs of the drive transistor 22) should be not more than the sum of the cathode voltage Vcath and the threshold voltage Vthel of the organic EL element 21 (i.e., not more than Vcath+Vthel).

In this case, the source voltage Vs of the drive transistor 22 rises faster to the degree that the capacitance value Cel of the parasitic capacitance (i.e., the equivalent capacitor) of the organic EL element 21 is small, and also to the degree that the driving current for displaying white is large. For this reason, the mobility correction time is shortened in order to reliably conduct the mobility correction process.

The mobility correction time t can be expressed as $$t=(Ccs+Cel)\times\Delta Vs/Ids \quad (6)$$

where ΔVs is the amount by which the source voltage Vs of the drive transistor 22 rises during mobility correction operation, and Ids is the current flowing during mobility correction.

As the above Eq. 6 demonstrates, the mobility correction time t becomes shorter with increasing values of the current Ids during mobility correction. The mobility correction time t becomes longer with increasing values of the capacitance value Cel of the equivalent capacitor in the organic EL element 21.

If the mobility correction time t is short, then control of the mobility correction time t becomes difficult. Thus, in order to lengthen the mobility correction time t, the capacitance value Cel of the equivalent capacitor of the organic EL element 21 is increased. However, increasing the size of the organic EL element 21 in order to increase the capacitance value Cel has an upper limit dictated by the aperture ratio of the pixel 20. From this additional perspective, it is again preferable to compensate for insufficient capacitance in the organic EL element 21 by adding an auxiliary capacitor between the anode of the organic EL element 21 and a fixed potential node.

Also, as described earlier, the size (and thus the driving performance) of the drive transistor 22 differs for each emitted color, due to the differing luminous efficiency of the organic EL element 21 for each emitted color. Consequently, if the combined capacitance of the organic EL element 21 and the auxiliary capacitor is constant, then discrepancies will occur in the mobility correction time t, depending on the emitted color. Thus, in order to make the mobility correction time t constant irrespective of emitted color, the capacitance Csub of the auxiliary capacitor is changed according to the emitted color.

In other words, the capacitance Csub of the auxiliary capacitor added to the pixel 20 differs for each emitted color of the organic EL element 21. As one example, consider the case of a single pixel that acts as one unit for forming a color image, being made up of three pixels (i.e., sub-pixels) R (red), G (green), and B (blue). In this example, the capacitance Csub differs among the respective auxiliary capacitors in the R, G, and B pixels.

(Auxiliary Capacitor Layout)

If the driving current is increased for organic EL elements 21 designed for larger display apparatus, then the differences among the parasitic capacitances Cel of the organic EL elements 21 for each color will become even greater. For this reason, the size of the auxiliary capacitor added to the pixel 20 will become very large. One way of laying out such a large auxiliary capacitor is shown by way of example in FIG. 10.

FIG. 10 shows a color array made up of repeating units of the three pixels (i.e., sub-pixels) RGB. The pixel layout is such that, in this color array, pairs of adjacent pixels in the horizontal direction are symmetric about a boundary line O separating those two pixels. By adopting such a pixel layout, the signal lines 33R, 33G, and 33G vertically disposed for each pixel column extend along the pixel edges opposite those of the boundary lines O.

As a result, the signal lines 33R, 33G, and 33B do not exist in the vicinity of the pixel edges corresponding to the boundary lines O, as shown in FIG. 10. For this reason, it becomes possible to create each auxiliary capacitor 25 straddling the boundary between two adjacent pixels. By forming each auxiliary capacitor 25 so as to straddle the boundary between two pixels, it becomes possible to lay out large-size auxiliary capacitors 25. By way of example, FIG. 10 shows auxiliary capacitors 25B for the B pixels.

(Laser Annealing)

In low-temperature polysilicon TFTs, excimer laser annealing (ELA) is typically used in order to crystallize amorphous silicon. However, while TFTs created with excimer laser annealing exhibit high mobility, such TFTs also exhibit large fluctuations in threshold voltage and mobility. There also exists the additional problem of such fluctuations appearing in striped patterns.

In contrast, there also exists laser thermal annealing (LTA), which anneals and micro-crystallizes the amorphous silicon in TFTs using the heat from a fixed laser. With laser thermal annealing, fluctuations in threshold voltage and mobility are small, and thus any intensity fluctuations caused by the above fluctuations are not easily detected. Furthermore, laser thermal annealing yields a mobility two or three times that of amorphous silicon.

Laser annealing will now be considered. FIGS. 11A and 11B illustrate a pixel layout when performing laser annealing. FIG. 11A is a plan view of the pixel layout, while FIG. 11B is a cross-section view of FIG. 11A taken along the line XIB.

The laser annealing step is performed prior to the aluminum (Al) vapor deposition step, and thus Al does not yet exist in the pixels. In addition, although the amorphous silicon layer is formed in islands in FIGS. 11A and 11B, during actual laser annealing the amorphous silicon layer is deposited over the entire panel.

Annealing by laser involves irradiating a substrate with laser light, with the substrate having an amorphous silicon layer deposited over the entire panel. The substrate is heated by the light, causing the amorphous silicon to micro-crystallize. In addition, in laser thermal annealing, the laser can be made to irradiate just particular pixel sites. For this reason, it becomes possible to form low-resistance leads in the non-irradiated portions using a metal with a low melting point (such as Al), as shown in FIGS. 11A and 11B. By forming such low-resistance leads, signal propagation delay due to wiring resistance can be significantly alleviated. This has the merit of facilitating display panel enlargement as a result.

The case of performing laser annealing with respect to the pixel layout shown in FIG. 10 will now be considered. FIG. 12 illustrates the layout of metal leads during laser annealing, in the case of the pixel layout shown in FIG. 10. By way of example, FIG. 12 illustrates the case where the auxiliary capacitor 25B added to each B pixel is larger in size than those of the other colors. The auxiliary capacitors for the R and G pixels have been omitted from illustration.

In FIG. 12, B pixels are disposed every third pixel in the horizontal direction. For this reason, an auxiliary capacitor 25B is not formed at the portion where an R pixel and a G pixel adjoin in a line-symmetric manner. In other words, when the large-size auxiliary capacitor 25B for the B pixels is created to straddle the boundary between adjacent pixels, the auxiliary capacitor 25B is formed straddling the boundary where a B pixel adjoins an R pixel, or where a B pixel adjoins a G pixel. The auxiliary capacitor 25B is not formed between adjacent R and G pixels.

As shown in FIGS. 10 and 12, by adopting a layout wherein adjacent pairs of pixels in the horizontal direction are line-symmetric about a boundary line O, the large-size auxiliary capacitor 25B can be formed as described earlier. However, in the pixel layout shown in FIG. 12 (i.e., in a pixel layout where there exist pixel pairs between which an auxiliary capacitor 25B is not formed), the metal layer forming each auxiliary capacitor 25 is intermittent on each line when just viewing R pixels or G pixels.

For this reason, in the laser annealing step, heat transfer to the amorphous silicon on the TFT differs according to the presence or absence of the metal pattern for the auxiliary capacitor 25B, which causes the TFT characteristics to become non-uniform, as described earlier. As a result, striping occurs in each line, which causes the image quality of displayed images to suffer.

Consequently, given a pixel layout having auxiliary capacitors formed straddling adjacent pixel pairs in the horizontal direction, it is desirable to provide a pixel layout whereby TFT characteristics can be made uniform using laser annealing. Hereinafter, specific embodiments of the present invention will be described.

2. First Embodiment

Pixel Circuit

Figure 13:
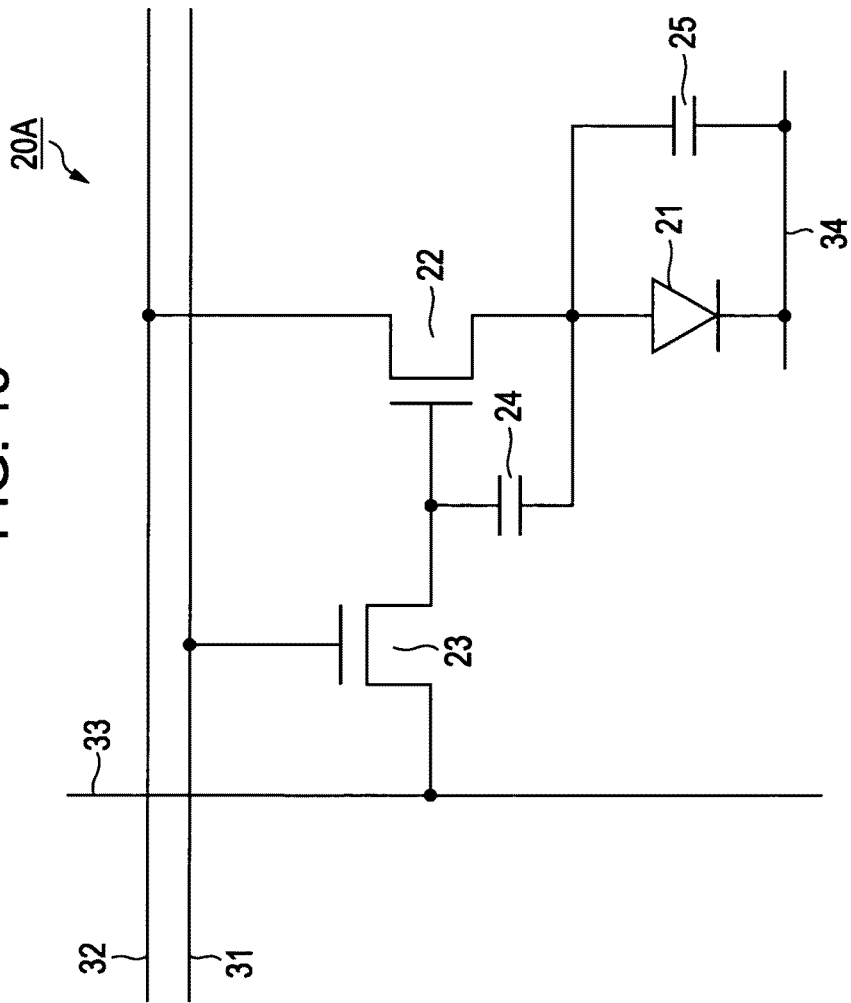
FIG. 13 is a circuit diagram illustrating a pixel circuit in accordance with a first embodiment.

FIG. 13 is a circuit diagram illustrating the pixel circuit of a pixel 20A in accordance with the first embodiment. In FIG. 13, identical reference numbers are used for portions equivalent to those shown in FIG. 2.

As shown in FIG. 13, the pixel 20A in accordance with the present embodiment includes a drive transistor 22, a write transistor 23, and a hold capacitor 24, which act as the driving circuit for an organic EL element 21. In addition, the pixel 20A also includes an auxiliary capacitor 25. The auxiliary capacitor 25 is connected between the anode of the organic EL element 21 (i.e., the source electrode of the drive transistor 22) and a common power supply line 34, which acts as a fixed potential node.

(Pixel Layout)

Figure 14:
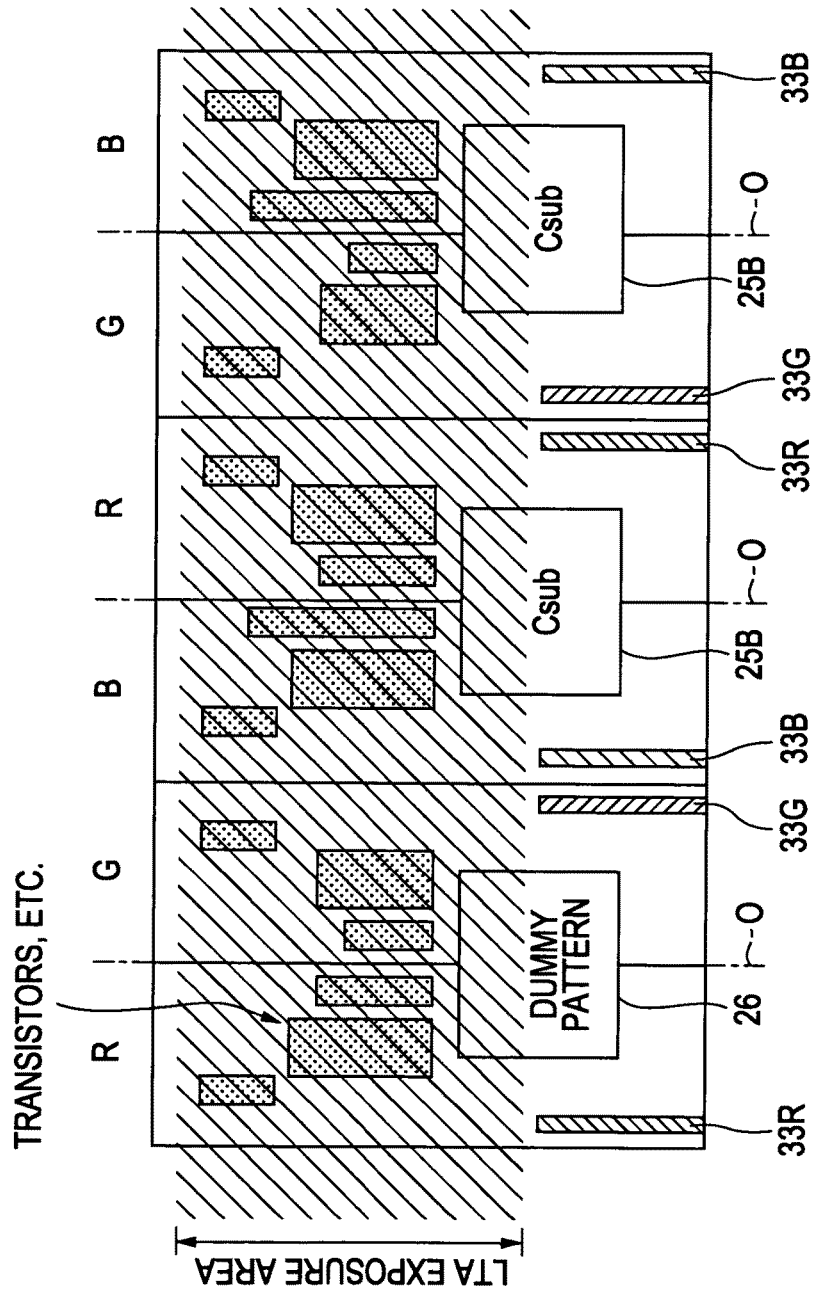
FIG. 14 is a plan view illustrating the pixel layout of pixels in accordance with the first embodiment.

FIG. 14 is a plan view illustrating the pixel layout of the pixel 20A in accordance with the first embodiment. In FIG. 14, identical reference numbers are used for portions equivalent to those shown in FIG. 12. By way of example, FIG. 14 shows the case where an auxiliary capacitor 25B is laid out for each B pixel. The auxiliary capacitors for the R and G pixels have been omitted from illustration. As described earlier, the auxiliary capacitor 25B for each B pixel is larger in size than the auxiliary capacitors for the other colors.

In FIG. 14, when laying out a large-size auxiliary capacitor 25B for each B pixel across adjacent pixel regions, each auxiliary capacitor 25B is formed straddling the boundary between specific pixel pairs. More specifically, an auxiliary capacitor 25B is formed straddling the boundary between a B pixel and its adjacent R pixel, or between a B pixel and its adjacent G pixel. In contrast, an auxiliary capacitor 25B is not formed between pixel pairs other than the specific pixel pairs. In other words, an auxiliary capacitor 25B is not formed between adjacent R and G pixels.

Consequently, in the pixel layout in accordance with the first embodiment, an island metal pattern 26 is formed at each region between the R and G pixels where an auxiliary capacitor 25B is not formed. In other words, a metal pattern 26 is formed at a site corresponding to that of the auxiliary capacitor 25B. This metal pattern 26 becomes a dummy pattern of the metal pattern for the auxiliary capacitor 25B for each B pixel. Herein, the metal pattern 26 may also be a pattern that differs from the metal pattern for the auxiliary capacitor 25B.

By adopting the pixel layout in accordance with the first embodiment as described above, a metal pattern corresponding to the auxiliary capacitor 25B for each B pixel will exist between any two pixels. In so doing, heat transfer to the amorphous silicon on the TFT during laser annealing can be prevented from changing significantly.

In other words, according to the pixel layout in accordance with the first embodiment, heat transfer to the amorphous silicon on the TFT during laser annealing becomes uniform (i.e., regular). In so doing, the TFT characteristics resulting from laser annealing can be made regular, and uniform image quality is obtained, free from irregularities caused by fluctuations in TFT characteristics.

Additionally, as described earlier, with laser thermal annealing, the laser can be made to irradiate just particular pixel sites. For this reason, it becomes possible to form low-resistance leads in the non-irradiated portions using a metal with a low melting point (such as Al). In the present example, the signal lines 33R, 33G, and 33B have such low-resistance leads formed in the portions not irradiated by the laser.

By using low-resistance leads for a portion of the signal lines 33R, 33G, and 33B in this way, propagation delay of the signal voltage Vsig of the picture signal or the reference potential Vofs can be significantly alleviated, which facilitates enlargement of the display panel 70. It should be appreciated that for the signal lines 33R, 33G, and 33B, other metal wiring is used at the sites irradiated by the laser, which are then made to electrically contact the above leads.

3. Second Embodiment

Pixel Circuit

Figure 15:
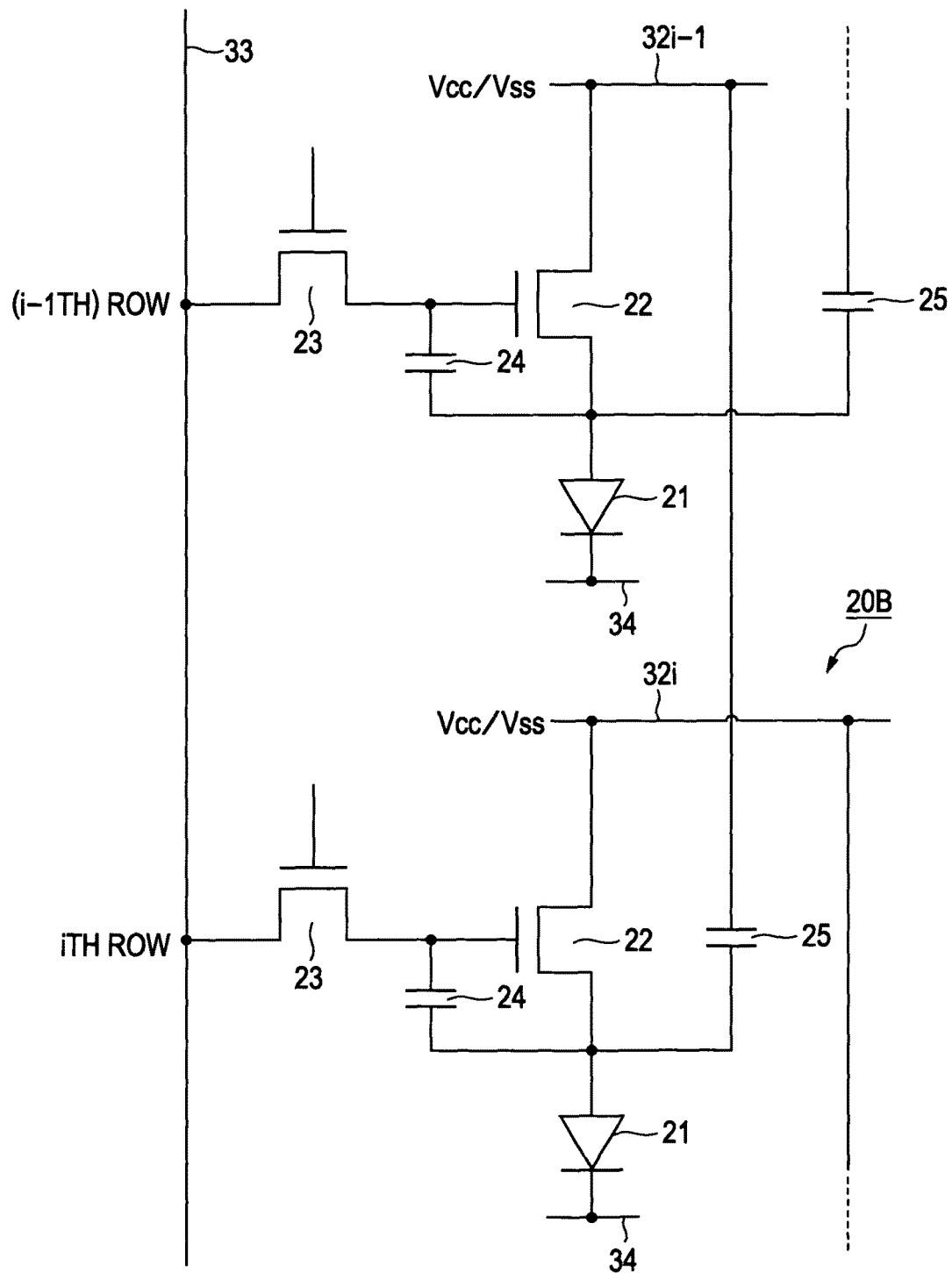
FIG. 15 is a circuit diagram illustrating pixel circuits in accordance with a second embodiment.

FIG. 15 is a pixel diagram illustrating the pixel circuit of a pixel 20B in accordance with the second embodiment. In FIG. 15, identical reference numbers are used for portions equivalent to those shown in FIG. 2.

As shown in FIG. 15, the pixel 20B in accordance with the present embodiment includes a drive transistor 22, a write transistor 23, and a hold capacitor 24, which act as the driving circuit for an organic EL element 21. In addition, the pixel 20B also includes an auxiliary capacitor 25. The auxiliary capacitor 25 is connected between the anode of the organic EL element 21 (i.e., the source electrode of the drive transistor 22) and the drive line 32 of the preceding pixel row in the scanning direction.

More specifically, if row scanning is taken to proceed from top to bottom in FIG. 15, then one terminal of the auxiliary capacitor 25 of the ith pixel 20Bi is connected to the anode of the organic EL element 21, while the other terminal is connected to the drive line 32$i$−1 on the (i−1)th row (i.e., the preceding row). As demonstrated in the description of circuit operation earlier described with reference to the timing waveform diagram shown in FIG. 4, the potential DS of one of the drive lines 32 becomes the low potential Vss during the threshold correction preparation period (t1 to t3), while becoming the high potential Vcc during all other periods.

When driving the current (i.e., the ith) pixel row, the potential of the drive line 32$i$−1 of the preceding (i.e., the (i−1)th) pixel row becomes the high potential Vcc, and enters a pseudo-fixed potential state. Consequently, when the ith row is selected and the auxiliary capacitor 25 performs its function, the drive line 32$i$−1 on the (i−1)th row becomes a fixed potential node for the auxiliary capacitor 25 on the ith pixel row. In so doing, the auxiliary capacitor 25 is able to sufficiently perform its function, or in other words, sufficiently compensate for the insufficient capacitance in the organic EL element 21.

In this way, the layout becomes similar to that of the first embodiment, even when adopting the pixel layout in accordance with the second embodiment wherein the other terminal of the auxiliary capacitor 25 is connected to the drive line 32 of the preceding row. In other words, as shown in FIG. 14, the layout is such that island metal patterns 26 are formed as dummy patterns in the regions between the R and G pixels where an auxiliary capacitor 25B is not formed. In so doing, advantages are achieved that are similar to those of a pixel layout in accordance with the first embodiment.

Figure 16:
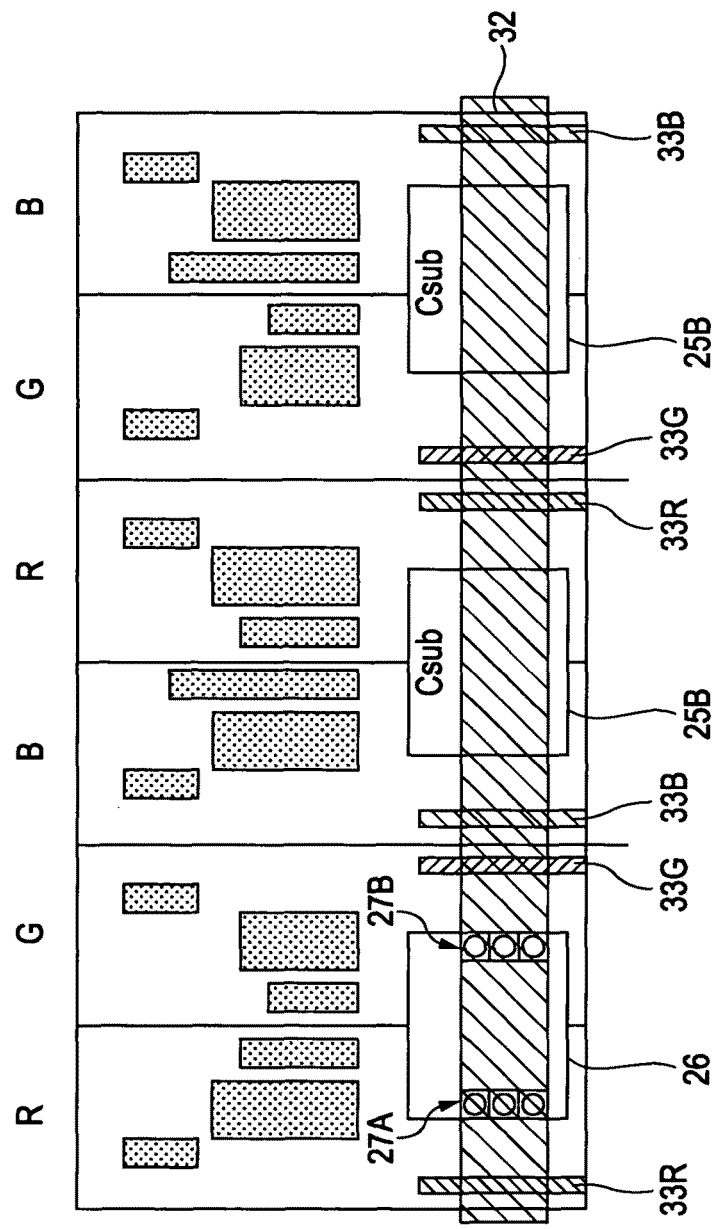
FIG. 16 is a plan view illustrating the pixel layout of pixels in accordance with the second embodiment.

In addition, the drive lines 32 are disposed such that the drive line 32 of the preceding pixel row is formed above the regions in the current pixel row where the auxiliary capacitors 25B are formed. Additionally, as shown in FIG. 16, both horizontal ends of the metal pattern 26 are electrically connected to the drive line 32 via contacts 27A and 27B. By adopting such a configuration, the metal patterns 26 and the portions of the drive lines 32 corresponding to the metal patterns 26 become connected in parallel. For this reason, lower wiring resistance is realized in the drive lines 32 compared to the case where the drive lines 32 are not connected to the metal patterns 26 in parallel.

As a result, if the wiring resistance of the drive lines 32 is already sufficient in the case where the drive lines 32 are not connected to the metal patterns 26 in parallel, then the wire width of the drive lines 32 may be reduced by an amount corresponding to the lowered resistance that can be achieved. As a result, it becomes possible to further miniaturize the pixels 20, while also contributing to increased yield due to suppressing the occurrence of shorts among wires.

In addition, by realizing lowered wiring resistance in each drive line 32, the load on the drive lines 32 can be decreased, thereby making it possible to realize a larger and higher definition display panel 70. Furthermore, voltage drops due to wiring resistance in the drive lines 32 can be suppressed. In so doing, the difference in the potential DS of the drive lines 32 when displaying a high tone versus displaying a low tone can be made smaller, and thus image quality problems such as cross-talk can be suppressed.

4. Modifications

In the foregoing embodiments, the driving circuit of the organic EL element 21 is described by way of example as having a two-transistor (2Tr) configuration. In other words, the driving circuit of the organic EL element 21 basically includes the following two transistors: the drive transistor 22, and the write transistor 23. However, the present invention is not limited in application to 2Tr configurations.

Besides 2Tr configurations, a variety of other pixel configurations are conceivable, such as configurations that include a transistor for controlling emission/non-emission of the organic EL element 21, or configurations that include a switching transistor that selectively writes the reference potential Vofs to the gate electrode of the drive transistor 22. In the case of adopting a pixel configuration that includes a transistor for controlling emission/non-emission, the potential of a drive line that supplies a power supply potential (i.e., a driving potential) to a pixel becomes the high potential Vcc. The technology enabling lowered resistance by connecting to the metal pattern 26 in parallel can also be applied to such a drive line.

In addition, in the foregoing embodiments, a pixel layout is described by way of example, wherein two adjacent pixels are line-symmetric about the boundary line O separating the two pixels. However, the present invention is not limited to line-symmetric pixel layouts, and an embodiment thereof may be applied to any pixel layout wherein an auxiliary capacitor 25 may be formed straddling the boundary between two pixels.

Furthermore, the foregoing embodiments are described by way of example as being applied to an organic EL apparatus that uses organic EL elements as the electro-optical elements of the pixels therein. However, the present invention is not limited to such examples of application. More specifically, it is possible to apply an embodiment of the present invention to general display apparatus that use current-driven electro-optical elements (i.e., light-emitting elements) configured to emit light whose intensity varies according to the value of the current flowing into the device. Such electro-optical elements may be inorganic EL elements, LED elements, or semiconductor laser elements, for example.

5. Exemplary Applications

A display apparatus in accordance with an embodiment of the present invention as described in the foregoing may be applied to the display apparatus of various classes of electronic devices that take an externally-input or internally generated picture signal, and then display that picture signal as an image or video.

According to a display apparatus in accordance with an embodiment of the present invention, TFT characteristics can be made uniform using laser annealing so as to obtain uniform image quality without striping. Consequently, by using a display apparatus in accordance with an embodiment of the present invention as the display apparatus of various classes of electronic devices, it becomes possible to improve display quality in the display apparatus of such electronic devices.

A display apparatus in accordance with an embodiment of the present invention is also taken to include sealed, modular components. Such modular components include display modules formed by affixing a pixel array to the opposite side of a sheet of transparent glass or similar material, for example. The transparent opposite side may be provided with a color filter, protective or other films, as well as a light-shading film. The display module itself may also be provided with a circuit or flexible printed circuit (FPC) for transferring signals or other information between the pixel array and external components.

The following will describe specific examples of electronic devices to which an embodiment of the present invention has been applied. The various electronic devices shown in FIGS. 17 to 21G are given as examples of electronic devices having display apparatus to which an embodiment of the present invention may be applied, such as digital cameras, laptop computers, mobile phones or other mobile handsets, and video cameras.

Figure 17:
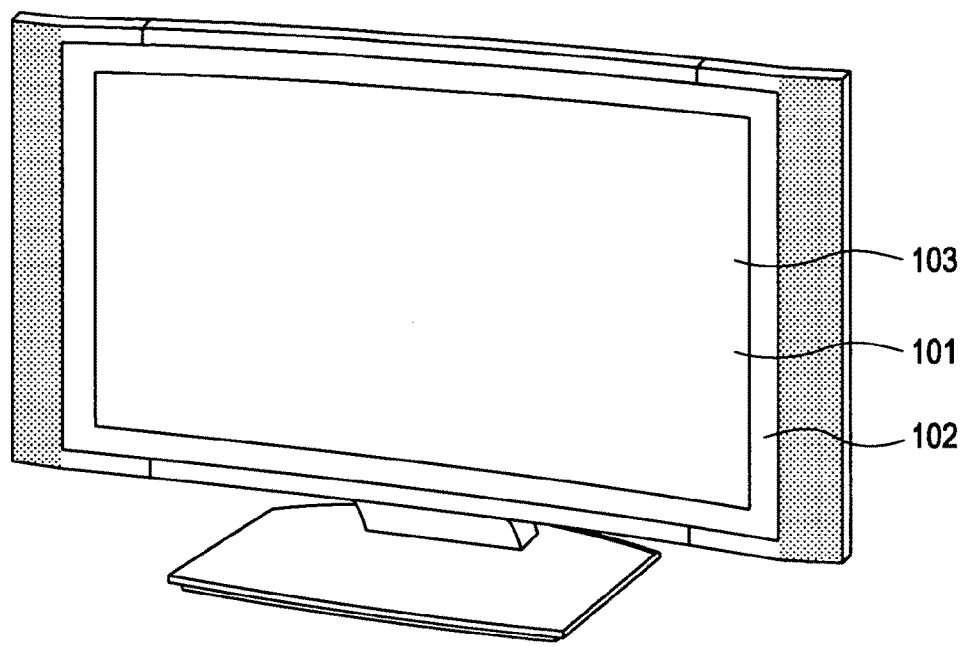
FIG. 17 is a perspective view illustrating the exterior of a television set to which an embodiment of the present invention has been applied.

FIG. 17 is a perspective view illustrating the exterior of a television set to which an embodiment of the present invention has been applied. A television set in accordance with the present exemplary application includes a picture display screen 101, which is made up of components such as a front panel 102 and a filter glass 103. A television set in accordance with the present exemplary application is manufactured by using a display apparatus in accordance with an embodiment of the present invention as the picture display screen 101.

Figure 18A:
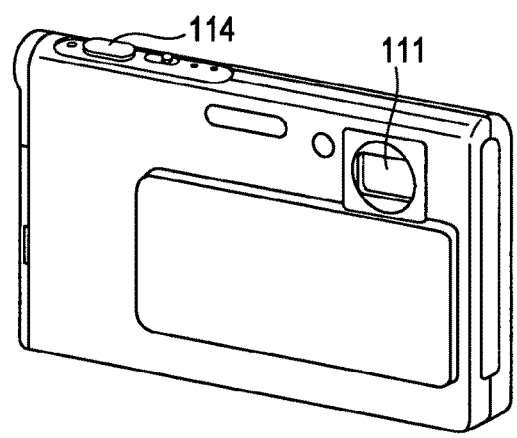
FIG. 18A is a front perspective view illustrating the exterior of a digital camera to which an embodiment of the present invention has been applied.
Figure 18B:
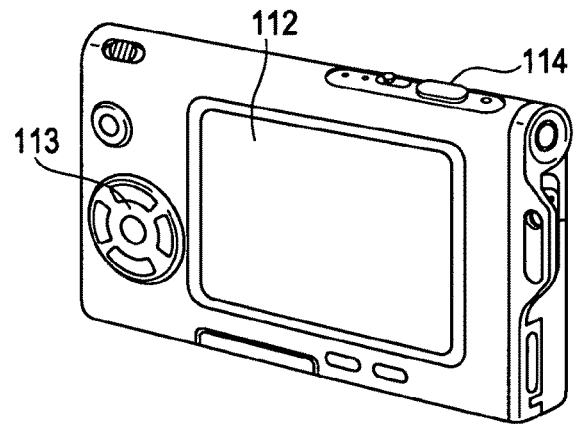
FIG. 18B is a rear perspective view illustrating the exterior of a digital camera to which an embodiment of the present invention has been applied.

FIGS. 18A and 18B are exterior views of a digital camera to which an embodiment of the present invention has been applied. FIG. 18A is a perspective view as seen from the front, while FIG. 18B is a perspective view as seen from the rear. A digital camera in accordance with the present exemplary application includes components such as a flash 111, a display 112, a menu switch 113, and a shutter button 114. A digital camera in accordance with the present exemplary application is manufactured by using a display apparatus in accordance with an embodiment of the present invention as the display 112.

Figure 19:
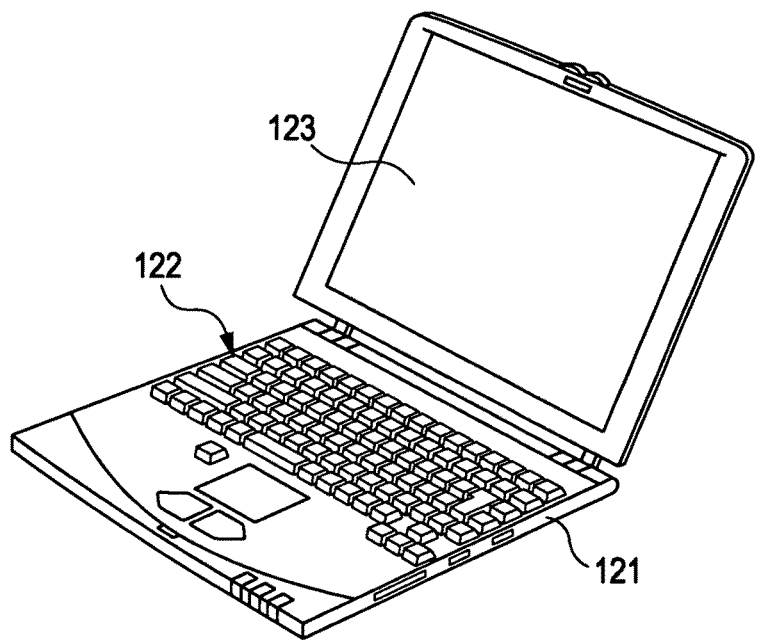
FIG. 19 is a perspective view illustrating the exterior of a laptop computer to which an embodiment of the present invention has been applied.

FIG. 19 is a perspective view illustrating the exterior of a laptop computer to which an embodiment of the present invention has been applied. A laptop computer in accordance with the present exemplary application includes components such as a keyboard 122 operated when inputting text or other information, and a display 123 that displays images, both being housed in a main body 121. A laptop computer in accordance with the present exemplary application is manufactured by using a display apparatus in accordance with an embodiment of the present invention as the display 123.

Figure 20:
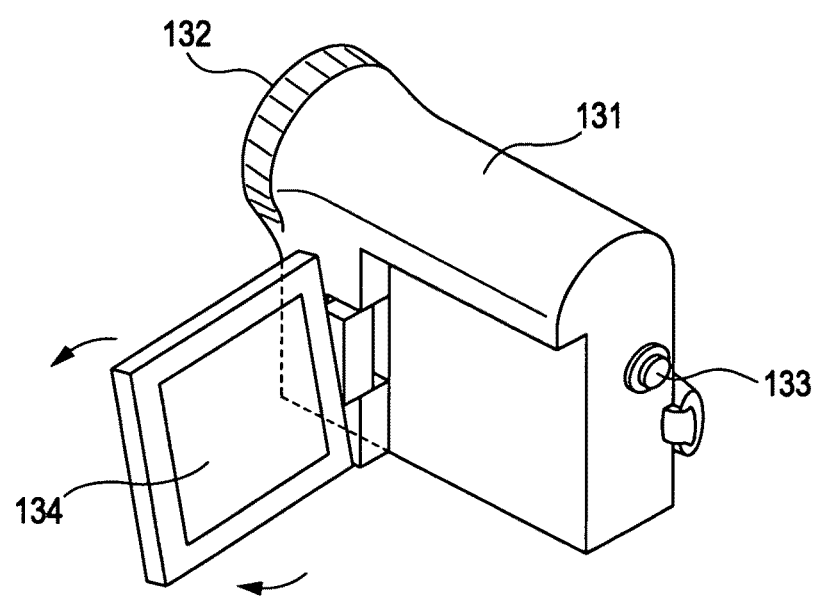
FIG. 20 is a perspective view illustrating the exterior of a video camera to which an embodiment of the present invention has been applied.

FIG. 20 is a perspective view illustrating the exterior of a video camera to which an embodiment of the present invention has been applied. A video camera in accordance with the present exemplary application includes components such as a main body 131, a lens 132 for acquiring images of a subject and provided on the side of the video camera that faces forward, a start/stop switch 133 used when recording, and a display 134. A video camera in accordance with the present exemplary application is manufactured by using a display apparatus in accordance with an embodiment of the present invention as the display 134.

FIGS. 21A to 21G are various exterior views of a mobile phone handset to which an embodiment of the present invention has been applied. The mobile phone handset is herein given as one example of a mobile handset. FIG. 21A is a front view of the mobile phone handset in the open state, while FIG. 21B is a side view of FIG. 21A. FIG. 21C is a front view of the mobile phone handset in the closed state, while FIGS. 21D to 21G are left, right, top and bottom views of FIG. 21C, respectively.

A mobile phone handset in accordance with the present exemplary application includes components such as an upper chassis 141, a lower chassis 142, a coupling unit (in this case, a hinge) 143, a display 144, a sub display 145, a picture light 146, and a camera 147. A mobile phone handset in accordance with the present exemplary application is manufactured by using a display apparatus in accordance with an embodiment of the present invention as the display 144 or the sub display 145.

The present application contains subject matter related to that disclosed in Japanese Priority Patent Application JP 2008-319252 filed in the Japan Patent Office on Dec. 16, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A display apparatus, comprising:
 a plurality of pixels disposed m an array, each pixel including an electro-optical element,
 a write transistor configured to write a picture signal,
 a drive transistor configured to drive the electro-optical element according to the picture signal written by the write transistor, and
 a hold capacitor, connected between the gate and source electrodes of the drive transistor, and configured to hold the picture signal written by the write transistors;

wherein the plurality of pixels are all grouped into pairs,
each pair comprising pixels adjacent to one another in the row direction, each of said pairs has an auxiliary capacitor area that straddles a boundary between the pixels of the respective pair, respective layouts of the auxiliary capacitor areas being substantially the same as one another, each pixel of a first subset of the plurality of pixels includes an auxiliary capacitor comprising a first electrode connected to the anode of the electro-optical element of the respective pixel and a second electrode connected to a first potential node, a region of overlap of the first and second electrodes defining the auxiliary capacitor, where a layout of the auxiliary capacitor corresponds to the auxiliary capacitor area of the pair that includes the respective pixels, and each of the pairs that does not include a pixel of the first subset has an island metal pattern, which is not the auxiliary capacitor of any of the plurality of pixels, and whose layout corresponds to the auxiliary capacitor area of the respective pair.

2. The display apparatus according to claim 1, wherein for each of said pairs, the pixels thereof have line-symmetric layouts about the boundary line between the pixels of the pair.

3. The display apparatus according to claim 1, wherein
for each pixel of the first subset, the first potential node is a power supply line configured to supply a power supply potential to ones of the plurality of pixels, and
the island metal pattern is connected in parallel to portions of a corresponding one of the power supply line wirings.

4. The display apparatus according to claim 3, wherein
each of the power supply lines controls light emission of ones of the electro-optical elements by selectively supplying a first power supply potential, or a second power supply potential lower than the first power supply potential, and
for each pixel of the first subset, the first potential node is the power supply line of the preceding pixel row.

5. The display apparatus according to claim 1, wherein each pixel includes a function for a mobility correction process, which corrects mobility in the drive transistor by applying negative feedback to the potential difference between the gate and source of the drive transistor, with the magnitude of the correction varying in accordance with the current flowing into the drive transistor.

6. The display apparatus according to claim 5, wherein the mobility correction process is conducted in parallel with the picture signal writing process conducted by the write transistor.

7. The display apparatus according to claim 1, wherein the island metal pattern is a dummy pattern.

8. The display apparatus of claim 7,
wherein, for each of the pairs that does not include a pixel of the first subset, the island pattern is not directly conductively connected to an element belonging to the one of the pixels of the respective pair.

9. The display apparatus according to claim 1, wherein for each pixel of the first subset, the first potential nodes is a cathode of the electro-optical element of the respective pixel.

10. The display apparatus according to claim 1, wherein each pixel of the first subset is configured to emit blue light.

11. The display apparatus of claim 10,
wherein each the pairs that does not include a pixel of the first subset does not have a pixel configured to emit blue light.

12. The display apparatus according to claim 1, wherein for each pixel of the first subset, the fixed potential node is connected to a drive line of a preceding pixel row in a scanning direction.

13. An electronic device comprising the display apparatus according to claim 1.

14. The display apparatus of claim 1,
wherein for each of said pairs, the auxiliary capacity area is substantially symmetric about the boundary between the pixels of the respective pair.

15. A pixel layout method for a display apparatus having a plurality of pixels disposed in an array, each pixel including
an electro-optical element,
a write transistor configured to write a picture signal,
a drive transistor configured to drive the electro-optical element according to the picture signal written by the write transistor, and
a hold capacitor, connected between the gate and source electrodes of the drive transistor, and configured to hold the picture signal written by the write transistor,
wherein the plurality of pixels are all grouped into pairs, each pair comprising pixels adjacent to one another in the row direction,
each of said pairs has an auxiliary capacitor area that straddles a boundary between the pixels of the respective pair, respective layouts of the auxiliary capacitor areas being substantially the same as one another,
the method comprising the steps of:
forming in each pixel of a first subset of the plurality of pixels an auxiliary capacitor comprising a first electrode connected to the anode of the electro-optical element of the respective pixel and a second electrode connected to a first potential node, a region of overlap of the first and second electrodes defining the auxiliary capacitor, where a layout of the auxiliary capacitor corresponds to the auxiliary capacitor area of the pair that includes the respective pixel; and
forming in each of the pairs that does not include a pixel of the first subset an island metal pattern, which is not directly conductively connected to any electro-optical element and whose layout corresponds to the auxiliary capacitor area of the respective pair.

16. The pixel layout method according to claim 15, wherein the island metal pattern is a dummy pattern.

17. The pixel layout method of claim 15,
wherein, for each of the pairs that does not include a pixel of the first subset, the island pattern is not directly conductively connected to an element belonging to the one of the pixels of the respective pair.

* * * * *